(12) United States Patent  
Hongo et al.

(10) Patent No.: US 6,582,580 B1  
(45) Date of Patent: Jun. 24, 2003

(54) SUBSTRATE PLATING APPARATUS

(75) Inventors: Akihisa Hongo, Tokyo (JP); Kenichi Suzuki, Tokyo (JP); Atsushi Chono, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/623,361

(22) PCT Filed: Mar. 2, 1999

(86) PCT No.: PCT/JP99/00994

§ 371 (c)(1), (2), (4) Date: Oct. 19, 2000

(87) PCT Pub. No.: WO99/45170

PCT Pub. Date: Sep. 10, 1999

(30) Foreign Application Priority Data

| Mar. 2, 1998 | (JP) | 10/066150 |
| Mar. 5, 1998 | (JP) | 10/071315 |
| Mar. 5, 1998 | (JP) | 10/071370 |
| Mar. 26, 1998 | (JP) | 10/096974 |
| Mar. 26, 1998 | (JP) | 10/100084 |

(51) Int. Cl.$^7$ .................. C25D 5/02; C25D 17/00; B05D 1/18; B05C 13/00

(52) U.S. Cl. .............. 205/118; 204/224 R; 427/430.1; 118/66

(58) Field of Search .............. 204/224 R, 242; 205/118; 118/429, 64, 66, 689, 692, 690, 691, 675, 676, DIG. 7; 427/430.1, 352, 299; 454/50, 53

(56) References Cited

U.S. PATENT DOCUMENTS 4,163,704 A * 8/1979 Murata ............. 204/206

(List continued on next page.)

FOREIGN PATENT DOCUMENTS

| JP | 63-143576 | 9/1988 |
| JP | 2-310393 | 12/1990 |
| JP | 5-48267 | 2/1993 |
| JP | 5-331651 | 12/1993 |
| JP | 6-57497 | 3/1994 |
| JP | 7-243052 | 9/1995 |

OTHER PUBLICATIONS

Merriam Webster's Collegiate Dictionary, 10$^{th}$ edition, 1996, Merriam–Webster, Incorporated, 2 pgs.*

Primary Examiner—Patrick Ryan  
Assistant Examiner—Thomas H. Parsons  
(74) Attorney, Agent, or Firm—Wenderoth, Lind & Ponack, L.L.P.

(57) ABSTRACT

An object of the present invention is to provide a substrate plating apparatus capable of performing continuous plating operations within one apparatus without the wafers becoming contaminated after the post-plating process by chemicals used in the plating process and the like. Further object is to provide a substrate plating apparatus capable of forming a plating film of uniform thickness on the plating surface of the wafer, while encouraging bubbles to escape from fine holes or grooves in the substrate surface and deterring particles from depositing on the plated surface. According to the present invention, there is provided a substrate plating apparatus for continuously performing a plating process and post-plating process within the same apparatus, the substrate plating apparatus comprising a contaminated zone within which the plating process is performed; a clean zone within which the post-plating process is performed; and a partition dividing the apparatus into the contaminated zone and the clean zone, wherein each zone is independently ventilated. A substrate plating apparatus for plating a surface of a substrate with a plating solution comprises a plating bath that is hermetically sealed and accommodates the substrate to be plated; and a flow path of the plating solution being formed to be parallel to the surface of the substrate.

5 Claims, 25 Drawing Sheets

U.S. PATENT DOCUMENTS

| | | | | |
|---|---|---|---|---|
| 4,357,900 A | * | 11/1982 | Buschor | 118/316 |
| 4,367,123 A | * | 1/1983 | Beck | 204/224 R |
| 5,769,948 A | * | 6/1998 | Oh et al. | 118/500 |
| 5,855,749 A | * | 1/1999 | Kohut et al. | 204/270 |
| 5,882,409 A | * | 3/1999 | Stahl | 118/200 |
| 5,932,077 A | * | 8/1999 | Reynolds | 118/429 |
| 6,322,630 B1 | * | 11/2001 | Carroll et al. | 118/125 |
| 6,352,623 B1 | * | 3/2002 | Volodarsky et al. | 118/500 |

* cited by examiner (post-plating process)

(post-plating process)

SUBSTRATE PLATING APPARATUS

BACKGROUND OF THE INVENTION

1. Technical Field

The present invention relates to a substrate plating apparatus, and particularly to a substrate plating apparatus for filling grooves for wiring formed in a semiconductor wafer with copper or another metal.

2. Description of the Related Art

Conventionally, wiring has been formed in a semiconductor wafer by first depositing a conductive layer on a wafer surface using sputtering or a similar technique. Next, unnecessary portions of the conductive layer are removed through a chemical dry etching process using a pattern mask formed of resist or the like.

In conventional processes, aluminum (Al) or an aluminum alloy has been used form the wiring. However, wiring has been made thinner to keep up with increased complexity of semiconductor devices. Increasing current density generates increased thermal stress and higher temperatures. This leads further to stress-migration or electro-migration that gives rise to such disorders as wiring breakage or short-circuiting.

To avoid an excessive generation of heat by current in the wiring, a metal having a higher conductivity such as copper must be used to form the wiring. However, it is difficult to perform dry etching on copper or a copper alloy that has been deposited over an entire surface as in the process described above. An alternative process would be to first form grooves for the wiring according to a predetermined pattern and then fill the grooves with copper or a copper alloy. This method eliminates the process of removing unnecessary parts of the conductive layer by etching, requiring only that the surface of the wafer be polished to remove uneven areas. The method has an additional benefit of being able to simultaneously form connecting areas called plugs that connect an upper layer and a lower layer of multi-layer wiring.

However, the shape of these wiring grooves and plugs have a considerably high aspect ratio (the ratio of depth to diameter or width) as the width of the wiring becomes smaller, making it difficult to fill the grooves with an even layer of metal using sputtering deposition. A chemical vapor deposition method (CVD) has been used for depositing various materials, but it is difficult to prepare an appropriate gas employing copper or a copper alloy. Further, when using an organic material, carbon (C) from the material becomes mixed with the deposition layer and increases a tendency toward migration.

Therefore, a method was proposed for performing electroless or electrolytic plating by immersing a substrate into a plating solution. With this method, it is possible to fill wire grooves having a high aspect ratio with a uniform layer of metal. However, when performing steps of this plating process consecutively in the same apparatus that must maintain a clean atmosphere, chemicals used in a preprocess and plating process become chemical mist and gas that are dispersed throughout the apparatus. The chemical mist and gas are thought to deposit on the substrate after a post-plating processes. This problem exists even when chemicals used in the preprocess and plating process are hermetically sealed in a process bath because the seal on the process bath must be broken to insert and remove wafers. Therefore, it is not possible to prevent the chemical mist and gas from dispersing throughout the apparatus with this construction.

BRIEF SUMMARY OF THE INVENTION

In view of the foregoing, it is an object of the present invention to provide a substrate plating apparatus capable of performing continuous plating operations within one apparatus without wafers becoming contaminated, after a post-plating processes, by chemicals used in a plating process and the like.

It is another object of the present invention to provide a substrate plating apparatus capable of forming a plating film of uniform thickness on a plating surface of a wafer, while encouraging bubbles to escape from fine holes or grooves in the plating surface and deterring particles from being deposited on the plated surface.

It is yet another object of the present invention to provide a substrate plating apparatus capable of automatically analyzing composition of a plating solution from time to time and quickly displaying results of the analysis on a monitor.

According to an aspect of the present invention, there is provided a substrate plating apparatus for continuously performing a plating process and a post-plating process within the same apparatus. The substrate plating apparatus comprises a contaminated zone within which the plating process is performed, a clean zone within which the post-plating process is performed, and a partition dividing the apparatus into the contaminated zone and the clean zone, wherein each zone is independently ventilated.

With this construction, the apparatus is partitioned into a contaminated zone in which chemical mist and vapor from chemicals used in the plating process are dispersed, and a clean zone in which a clean atmosphere is required. Each zone has an independent method for treating particles. Accordingly, the invention can prevent the chemical mist and vapor from being deposited on the substrate after completion of the post-process.

According to another aspect of the present invention, the partition is provided with a shutter that can be opened and closed. Hence, the substrate can be transferred between the contaminated zone and clean zone before conducting a preprocess, or after conducting the plating process, by opening the shutter provided in the partition.

According to another aspect of the present invention, air flow in the contaminated zone comprises a circulating flow circulating therein, and a supplied and discharged flow which is supplied externally into the contaminated zone and is discharged externally. The circulating flow flows downwardly as clean air from a ceiling of the apparatus through the contaminated zone and, after a scrubber and/or mist separator remove chemical mist or vapor of solution from the circulating flow, cycles back into the contaminated zone from the ceiling of the apparatus as clean air.

With this construction, a sufficient amount of clean air can be supplied to the contaminated zone, and particles can be prevented from contaminating a processed substrate while minimizing an amount of air flow that is supplied from an external source and exhausted.

According to another aspect of the present invention, the substrate plating apparatus further comprises conveying devices provided one in each of the clean and contaminated zones for conveying a substrate through the zones. Each conveying device has a hand portion for retaining the substrate, and a coarse washing chamber is disposed adjacent to the partition for coarsely washing the substrate while being retained by the hand portion of the conveying device provided in the contaminated zone after the plating process has been completed.

With this construction, the hand portion of the conveying device provided in the contaminated zone is washed along with the processed substrate. Hence, the invention can prevent contaminants from the plating solution deposited on the hand portion from being transferred onto the conveying device in the clean zone.

According to another aspect of the present invention, a method for plating a substrate by continuously performing a plating process and a post-plating process within the same apparatus, comprises: partitioning an inside of the plating apparatus with a partition to form a contaminated zone and a clean zone, with each zone being independently ventilated; disposing a conveying device in each of the clean and contaminated zones for conveying a substrate through the zones; disposing a coarse washing chamber adjacent to the partition; and coarsely washing the substrate while the same is retained by a hand portion of the conveying device disposed in the contaminated zone.

With this method, the hand portion of the conveying device disposed in the contaminated zone is washed along with the processed substrate. Hence, it is possible to remove plating solution deposited on the hand portion and prevent chemical mist and vapor from being introduced into the clean zone.

According to another aspect of the present invention, the method for plating a substrate further comprises the steps of withdrawing the hand of the conveying device after the coarse washing process is completed, coarsely washing the substrate again by itself, and subsequently conveying the substrate into the clean zone. With this method, it is possible to more effectively prevent chemical mist and vapor from being introduced into the clean zone.

According to another aspect of the present invention, a substrate plating apparatus for plating a surface of a substrate with a plating solution comprises a plating bath that is hermetically sealed and accommodates the substrate to be plated, and a flow path of the plating solution is formed to be parallel to the surface of the substrate. Since the plating solution flows parallel to the substrate surface, a more uniform plating layer can be formed on the surface of the substrate.

According to another aspect of the present invention, a substrate is maintained such that its surface is slanted in relation to a vertical plane. This construction prevents particles from depositing on a surface of a plated substrate.

According to another aspect of the present invention, the substrate plating apparatus further comprises a retaining device for retaining a substrate such that its surface is slanted from a vertical plane within a range of 30 degrees from vertical while a plating process is performed. With this construction, air bubbles can be easily dislodged from fine holes formed in the surface and plating solution can flow into the fine holes to form a plating layer on interior surfaces of the fine holes. Further, particles do not become deposited on the surface of the substrate.

According to another aspect of the present invention, a method for plating a surface of a substrate with a plating solution, comprises: disposing a substrate to be plated within a hermetically sealed plating bath; introducing plating solution into the plating bath; and plating the surface of the substrate while varying pressure of the plating solution and changing direction of the flow of the plating solution. With this method, a dense plating layer can be formed in fine grooves formed in the substrate surface.

According to another aspect of the present invention, plating solution flows parallel in relation to a surface of a substrate, and a width and length of a flow path of the plating solution are larger than a diameter of the substrate. Since the plating solution flows parallel to the surface of the substrate, a plating layer of uniform thickness can be formed on the surface.

According to another aspect of the present invention, a plating bath comprises a main section having an open area, a side plate capable of opening or closing to expose or cover the open area in the main section, a retaining mechanism for retaining a substrate on the side plate, and an annular packing disposed around the open area of the main section. The surface on an edge of the substrate mounted on the side plate contacts the packing when the open area of the main section is covered by the side plate, and a flow path of the plating solution is formed to be parallel to a surface of the substrate between the main section of the plating bath and the substrate.

With this construction, an inner edge of the annular packing protrudes in a funnel shape externally from the main section, and is pressed inwardly by contact from a periphery of the substrate. Accordingly, by setting pressure in the plating bath higher than that external to the plating bath, the packing presses firmly against the periphery of the substrate to increase a sealing effect.

According to another aspect of the present invention, an inner peripheral edge of the annular packing protrudes externally of the main section of the plating bath in a funnel shape and contacts a surface on the periphery of the substrate, and internal pressure in the plating bath generates a force on the packing for increasing sealing performance between the packing and the substrate.

According to another aspect of the present invention, the substrate plating apparatus further comprises a sensor for detecting whether a substrate is mounted on the side plate, whereby supply of plating solution to the plating bath is halted when the substrate is detected not to be mounted on the side plate based on output from the sensor.

Accordingly, by providing a sensor to detect existence of a substrate, and a device for stopping supply of plating solution to the plating bath when output from the sensor indicates that a substrate is not mounted in the apparatus, there is no danger of plating solution being supplied before an airtight space is formed between the main section of the plating bath and the substrate for supplying plating solution. As a result, plating solution will not leak out of the apparatus.

According to another aspect of the present invention, the main section of the plating bath further comprises a shielding plate disposed opposite the substrate. The shielding plate has an electric field adjusting hole formed approximately in a central portion of the main section, and an anode is fitted in the electric field adjusting hole such that a surface of the anode is approximately flush with a surface of the shielding plate. With this construction, plating solution can flow between the surfaces of the shielding plate and anode, and a surface of the substrate, with little agitation to enable formation of a uniform plating layer.

According to another aspect of the present invention, a substrate plating apparatus further comprises a sampling device for sampling plating solution at a fixed period, an automatic analyzing device for automatically analyzing components of the sampled plating solution, and a monitoring device for displaying results of analysis performed by the automatic analyzing device.

With this construction, it is possible to sample a plating solution used in a plating process at regular periods throughout the process, automatically analyze components of the samples, and quickly display results of the analysis.

According to another aspect of the present invention, the plating solution is an electrolytic copper plating solution and the automatic analyzing device measures at least one of copper ion concentration, sulfuric acid concentration, chlorine ion concentration, and additive concentration.

According to another aspect of the present invention, the plating solution is an electroless copper plating solution and the automatic analyzing device measures at least one of copper ion concentration, reductant concentration, pH, chelate concentration, dissolved oxygen, dissolved hydrogen, and additive concentration.

DETAILED DESCRIPTION OF THE INVENTION

A substrate plating apparatus according to preferred embodiments of the present invention will be described while referring to the accompanying drawings.

A substrate plating apparatus according to the present invention performs copper plating on a surface of a semiconductor substrate (wafer) in order to obtain a semiconductor device having wiring formed of the copper. This process is described with reference to FIGS. 1A–1C.

Figure 1A:
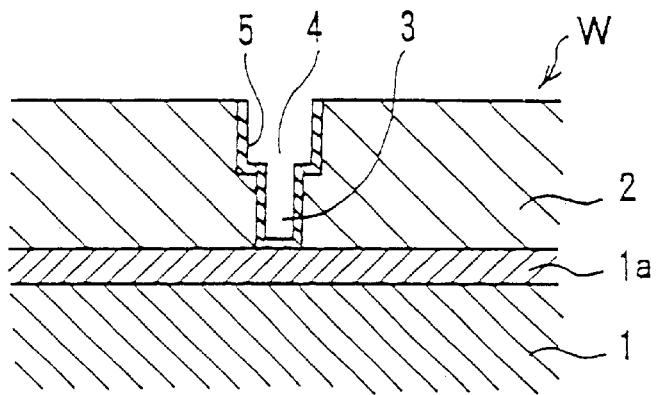
FIGS. 1A–1C show cross-sectional views of a plating process using a substrate plating apparatus.
Figure 1B:
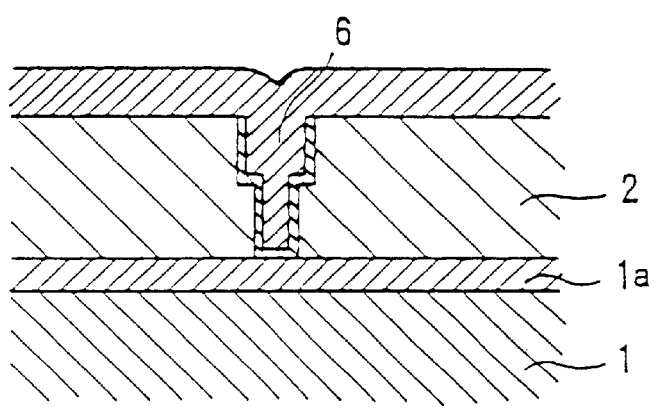

As shown in FIG. 1A, a semiconductor wafer W is comprised of a semiconductor material 1, a conductive layer 1a formed on a top surface of the semiconductor material 1, and an $SiO_2$ insulating layer 2 deposited on top of the conductive layer 1a. A contact hole 3 and a groove 4 are formed in the insulating layer 2 by a lithography and etching technique. A barrier layer 5, such as TiN, is formed over surfaces in the contact hole 3 and groove 4.

Figure 1C:
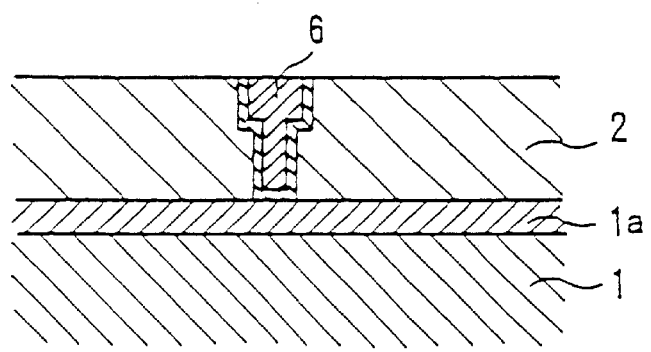

By performing a copper plating process on a surface of the semiconductor wafer W, a copper layer 6 is deposited so that the contact hole 3 and groove 4 are filled with copper, and copper is as well deposited on a top surface of the insulating layer 2. Next, chemical mechanical polishing (CMP) is performed to remove the copper layer 6 from the top surface of the insulating layer 2. This process is necessary to form a surface of the copper 6 filling the contact hole 3 and groove 4 to be approximately flush with the top surface of the insulating layer 2. As a result, the copper 6 forms wiring, as shown in FIG. 1C.

Figure 2:
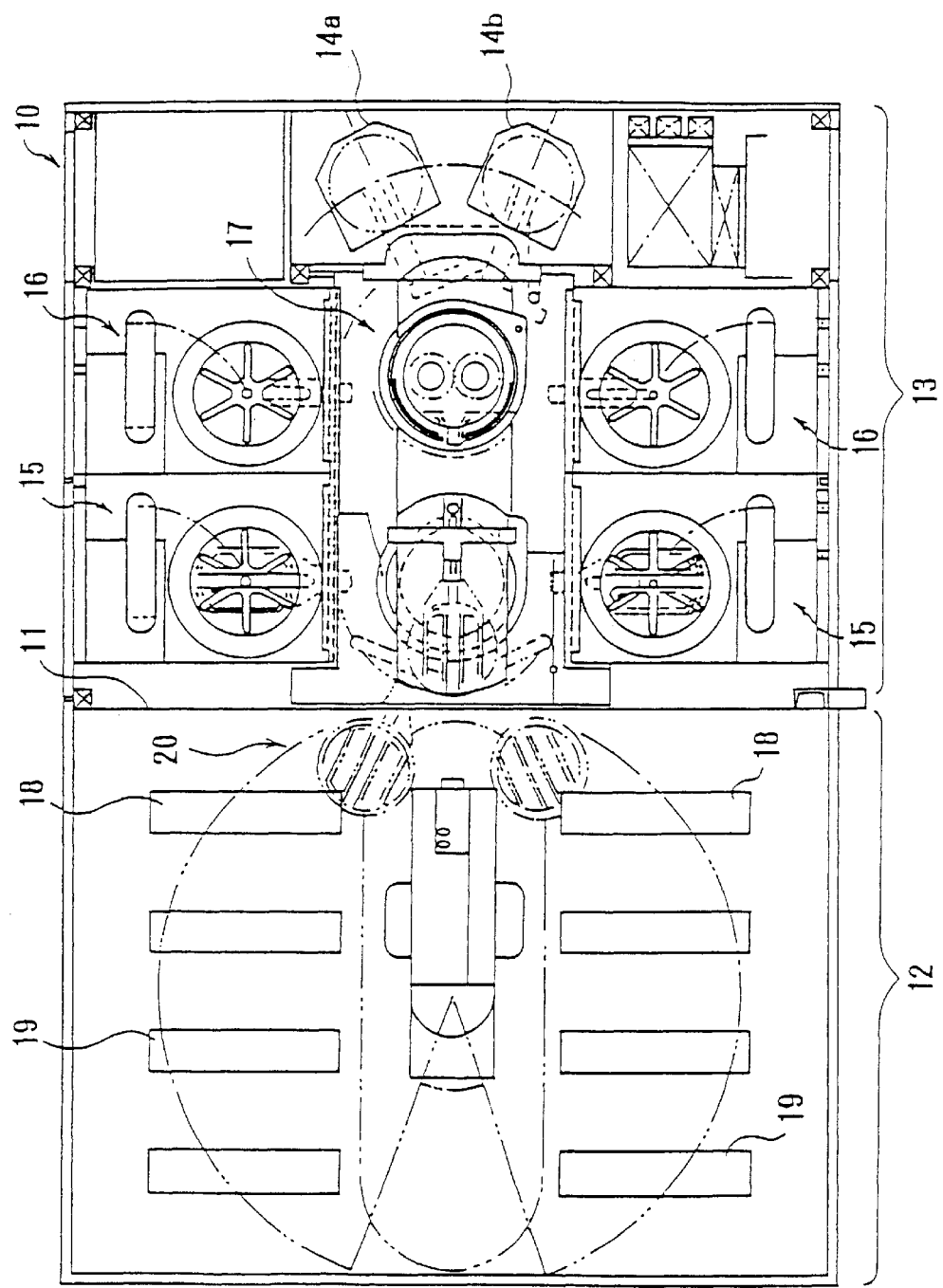
FIG. 2 is a plan view showing a layout of a plating apparatus according to a preferred embodiment of the present invention.

Next, a plating apparatus for performing electrolytic copper plating on the surface of the semiconductor wafer W, in accordacne with a first embodiment, will be described with reference to FIG. 2. As shown in the diagram, the plating apparatus is provided in rectangularly shaped equipment 10 and is configured to perform continuous copper plating of semiconductor wafers W. The equipment 10 is provided with a partition 11 to divide the equipment 10 into a contaminated zone 12 and a clean zone 13. The contaminated zone 12 and clean zone 13 are configured to be ventilated independently. The partition 11 is provided with a shutter (not shown) that can be opened and closed freely. Pressure within the clean zone 13 is set higher than that within the contaminated zone 12. Further, the apparatus is configured such that air from the contaminated zone 12 does not flow into the clean zone 13.

The clean zone 13 includes a loading unit 14a and an unloading unit 14b for accommodating wafer storage cassettes, two each of a washing device 15 and drying device 16 for performing post-plating processes, and a conveying device (conveying robot) 17 for conveying wafers within the clean zone 13. The washing device 15 can be either a pencil-type device with a sponge attached to an end thereof or a roller-type device with an attached sponge. The drying device 16 dries a wafer by spinning it at a high rate of speed.

The contaminated zone 12 is provided with preprocessing baths 18 for performing a preprocess on a substrate, plating baths 19 for performing a copper plating process, and a conveying device (conveying robot) 20 for transporting wafers within the contaminated zone 12. Each of the preprocessing baths 18 accommodates a preprocess solution containing sulfuric acid or the like. The preprocess is performed by immersing a wafer into the preprocess solution. Each of the plating baths 19 accommodates a plating solution containing copper sulfate. The copper plating process is performed by immersing the substrate into this plating solution.

Figure 3:
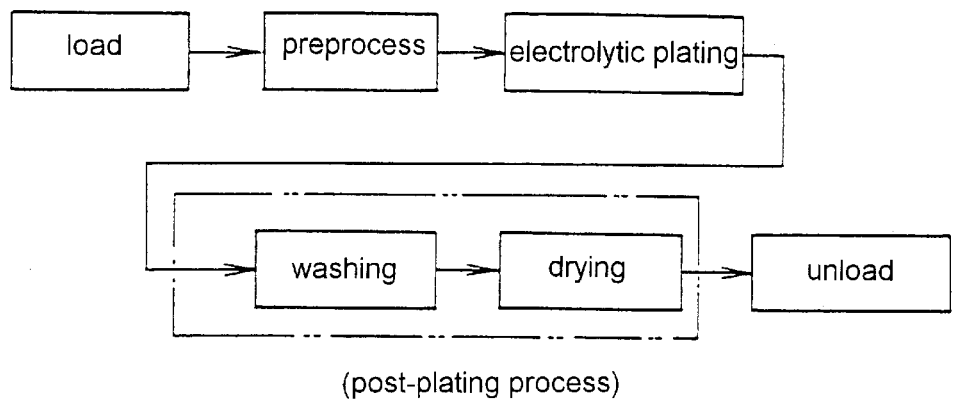
FIG. 3 is a block diagram showing an electrolytic plating process.

Next, an electrolytic copper plating process using the plating apparatus described above will be described with reference to FIG. 3. First, the conveying device 17 within the clean zone 13 extracts an unprocessed wafer from a wafer storage cassette in the loading unit 14a and transfers the wafer to the conveying device 20 in the contaminated zone 12. To perform this transfer the shutter in the partition 11 is opened and then closed after the transfer is made.

In the contaminated zone 12, the wafer is preprocessed by being immersed in the preprocess solution in the preprocessing baths 18. Subsequently, the copper plating process is performed by immersing the wafer in the plating solution accommodated in the plating baths 19. Since chemical mist and vapor from chemicals used in the preprocess and plating process are dispersed within the contaminated zone 12, an effective ventilation system is employed during each process to remove the chemical mist and vapor.

After the plating process is complete, the conveying device 20 in the contaminated zone 12 transfers the processed wafer to the conveying device 17 in the clean zone 13. Once again the shutter in the partition 11 must be opened to perform the transfer and closed immediately thereafter.

Post-plating processes on the wafer are then performed in the clean zone 13. These processes include washing by the washing device 15 and drying by the drying device 16. After the wafer has been dried, the conveying device 17 returns the wafer to a wafer storage cassette in the unloading unit 14b. Here, the washing and drying processes can also be performed using one unit. Since the clean zone 13 does not have the same problem with regard to dispersion of chemical mist and vapor, the above processes can be performed in a clean air environment.

In this way, the preprocess and plating process performed with chemicals are carried out in the contaminated zone 12, while post-plating processes that require a clean atmosphere are carried out in the clean zone 13 separated from the contaminated zone 12. Moreover, each zone has an independent system for treating particles, thereby preventing chemical mist and vapor from becoming deposited on the wafer after the post-plating processes.

Figure 5:
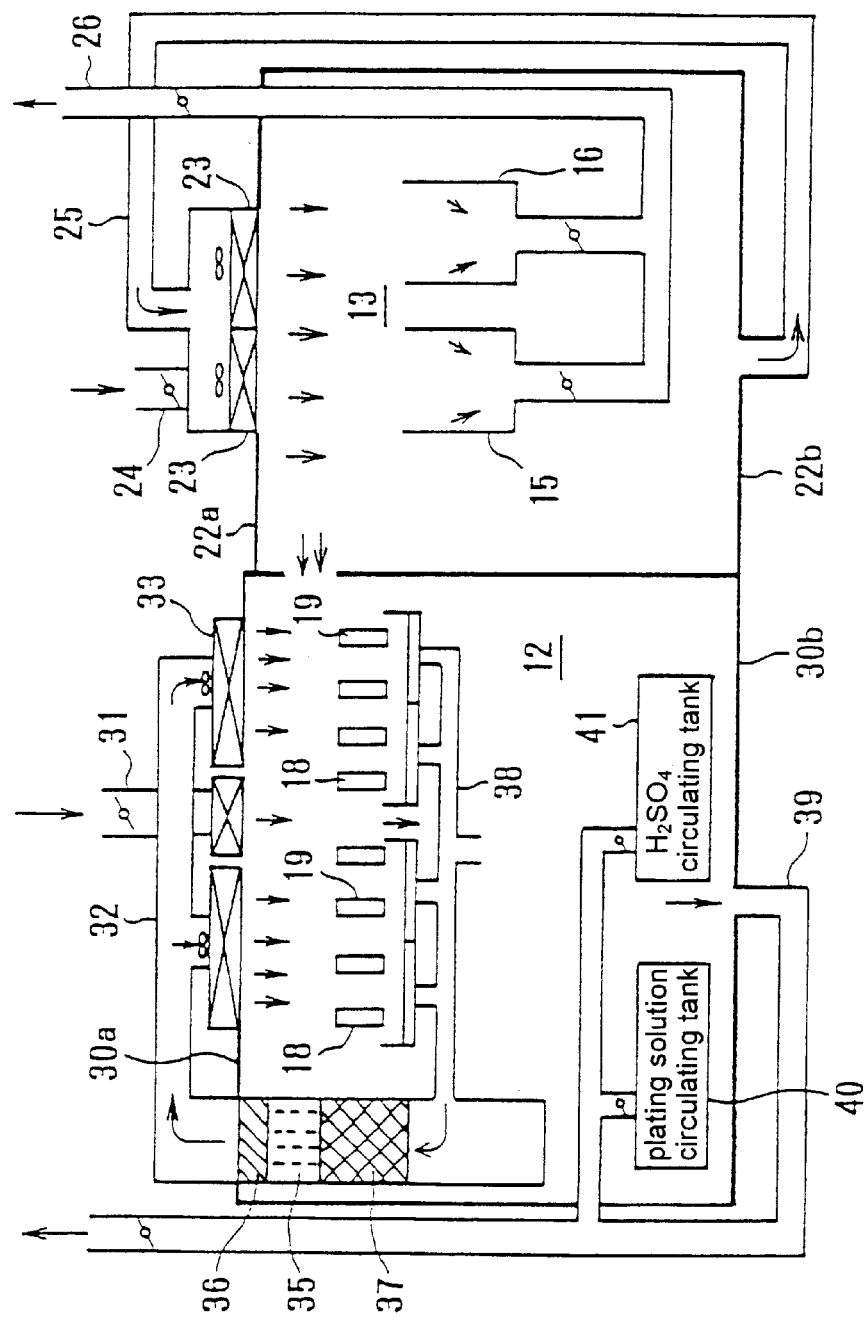
FIG. 5 is an explanatory diagram showing airflow within the plating apparatus of FIG. 2.

FIG. 5 illustrates airflow within the plating apparatus. In the clean zone 13, a fan introduces fresh external air into the clean zone 13 through a duct 24. The air is forced through a high performance filter 23 and flows down from a ceiling 22a to an area around the washing device 15 and drying device 16. Most of the air supply is recycled from a floor 22b through a circulating duct 25 and back to the ceiling 22a.

Then, the recycled air is forced by the fan through the filter 23 and back into the clean zone 13. A portion of the airflow is exhausted externally from the washing device 15 and drying device 16 via a duct 26.

Although the contaminated zone 12 housing the preprocessing baths 18 and plating baths 19 is called "contaminated", the zone can still not allow particles to be deposited on a wafer surface. To prevent such particle deposition on the wafer, clean air is supplied in a downward flow from a ceiling 30a in the contaminated zone 12. A fan forces the clean air through a high performance filter 33 disposed in the ceiling 30a. However, if the entire flow of clean air forming the downward flow in the contaminated zone 12 comprises air supplied from an external source, this would require an enormous amount of air supply. Hence, only enough air is exhausted externally through a duct 39 in order to maintain the contaminated zone 12 at a negative pressure. Most of the airflow is supplied as a cycled flow through ducts 32 and 38.

When air is circulated in this way, the clean air that passes through a room of preprocessing baths 18 and plating baths 19 accumulates chemical mist and vapor. This mist and vapor are removed when the air passes through a scrubber 35 and mist separators 36 and 37. As a result, air returned to the duct 32 on the ceiling side no longer contains chemical mist and vapor. Once again, the fan forces clean air through the filter 33 and back into the contaminated zone 12. A portion of the air circulating through the contaminated zone 12 is exhausted externally through the duct 39 in a floor 30b. Air from a plating solution circulating tank 40 and an $H_2SO_4$ circulating tank 41, which air also includes chemical mist and vapor, is also exhausted externally through the duct 39. An amount of fresh air corresponding to the amount of exhausted air is supplied through a duct 31 in the ceiling 30a to maintain the contaminated zone 12 at a negative pressure.

Figure 4:
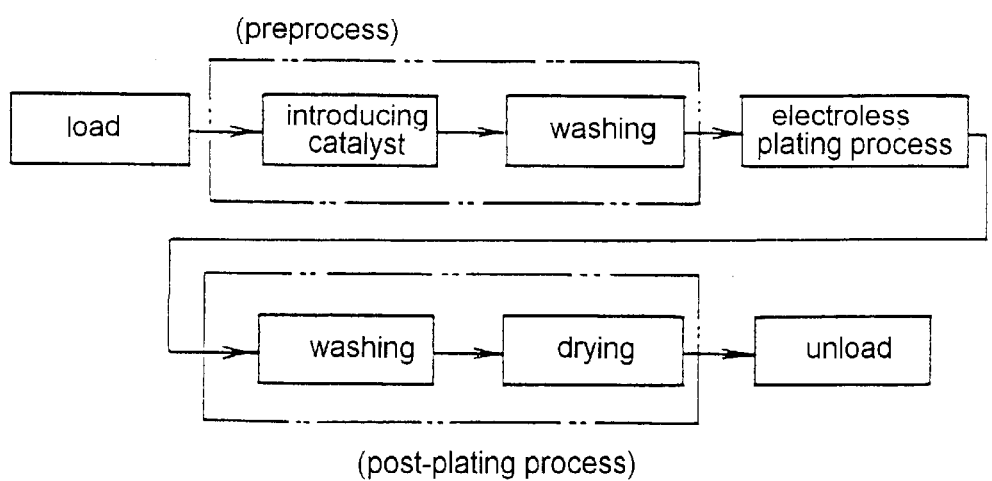
FIG. 4 is a block diagram showing an electroless plating process.

While the plating apparatus described above is an example of applying the invention to an apparatus for performing electrolytic copper plating, the present invention can also be applied to an apparatus for conducting electroless copper plating. In an electroless copper plating process, shown in FIG. 4, preprocess steps include introducing a catalyst and washing. Next, the electroless plating process is performed, after which the post-plating processes of washing and drying the substrate are conducted. By performing the catalyst addition and washing preprocesses, and also the electroless plating process in the contaminated zone, and the post-plating processes of washing and drying in the clean zone, it is possible to prevent chemical mist and vapor from being deposited on the substrate after completion of the post-plating processes. Note that the preprocesses can also be performed outside of the plating apparatus described above or eliminated altogether. In such cases, a preprocess bath and the like need not be provided in the plating apparatus.

As described above, a plurality of plating baths 19 is arranged in parallel in the contaminated zone 12. The construction of each plating bath 19 is shown in more detail in FIGS. 6 and 7. Further, the preprocessing bath 18 has the same construction as the plating bath 19, only containing a different type of fluid.

Figure 6:
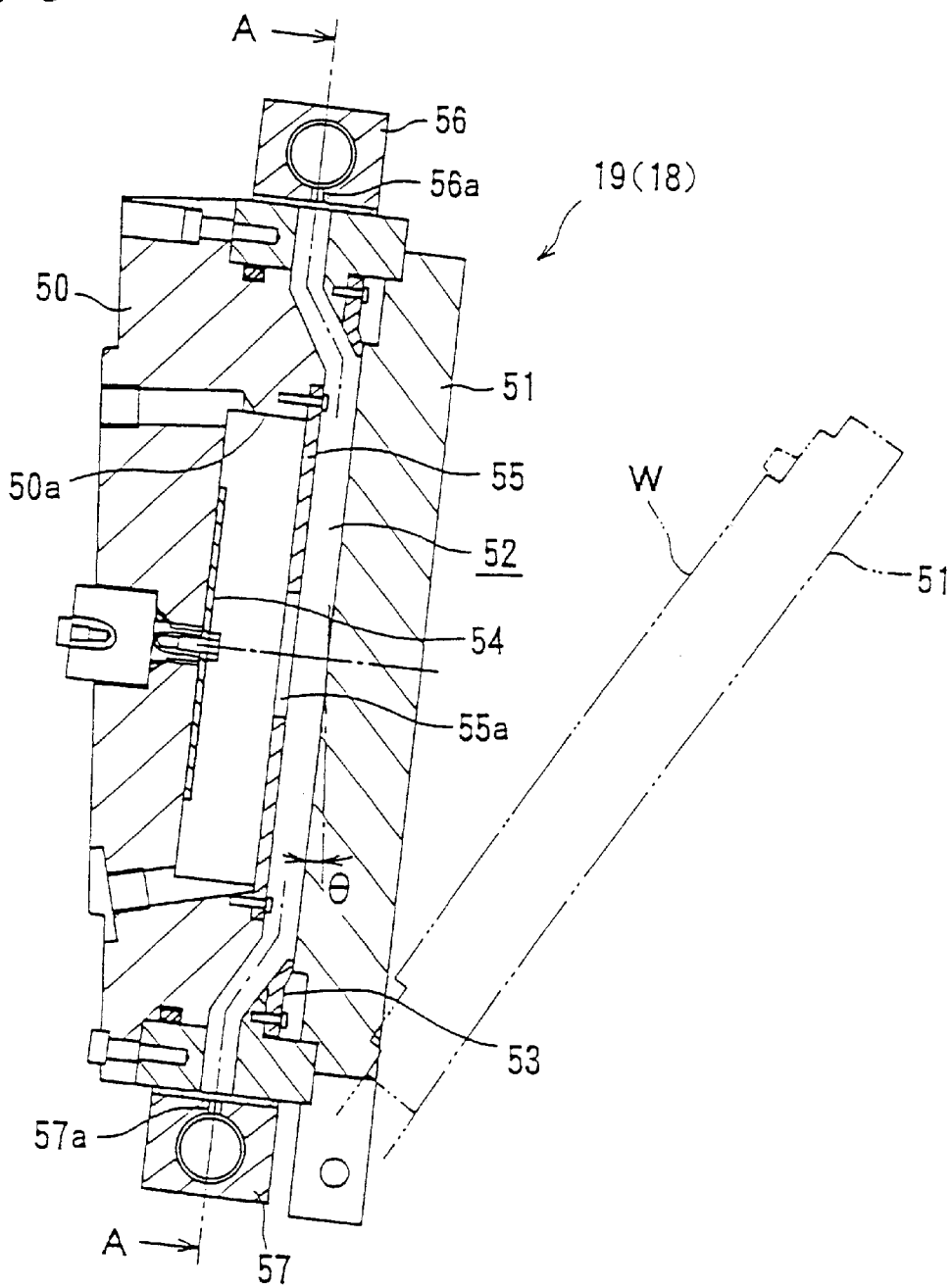
FIG. 6 is a vertical cross-sectional view showing a front of the plating apparatus of FIG. 2.
Figure 7:
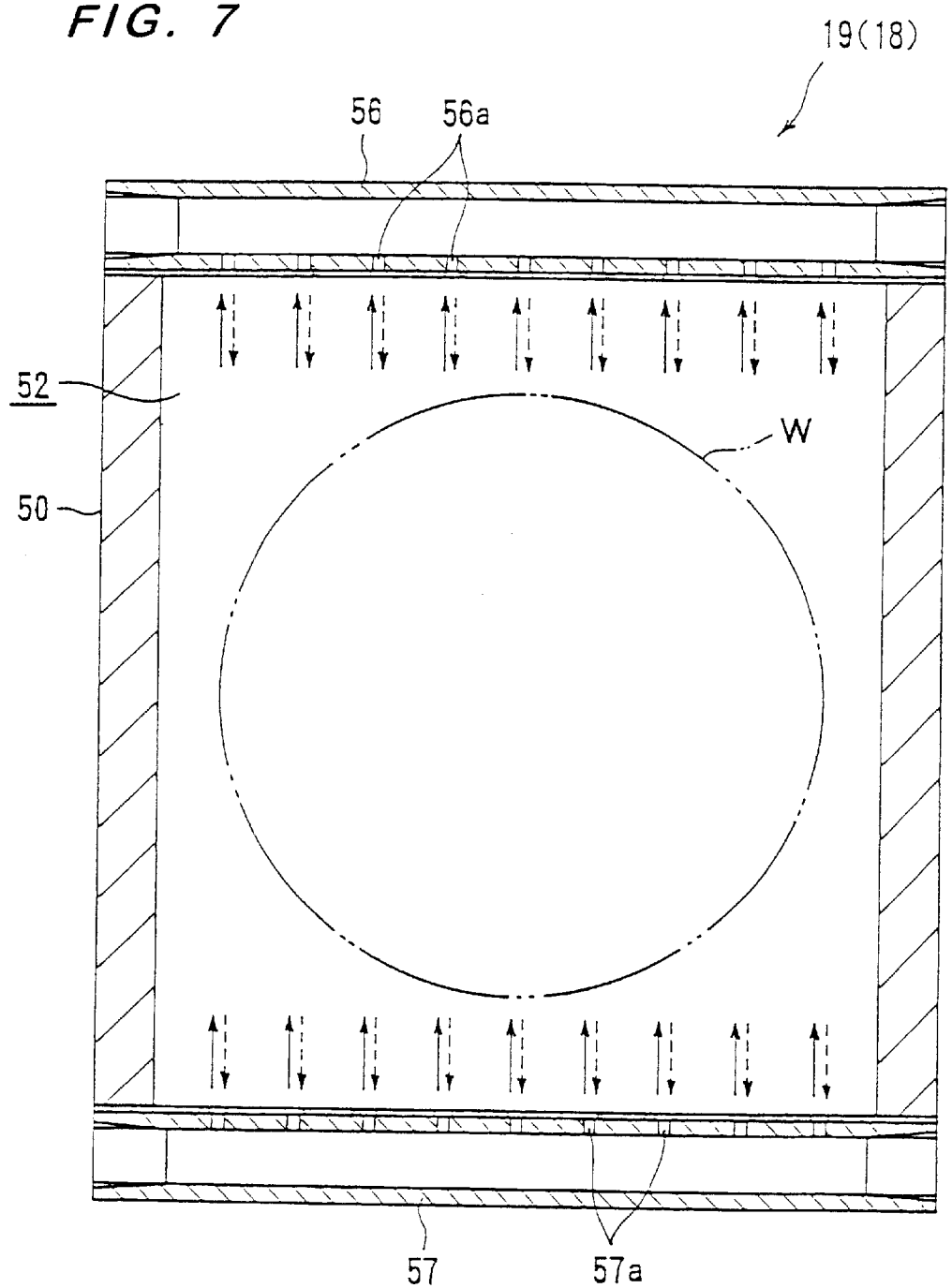
FIG. 7 is a cross-sectional view indicated by arrows A—A in FIG. 6.
Figure 8:
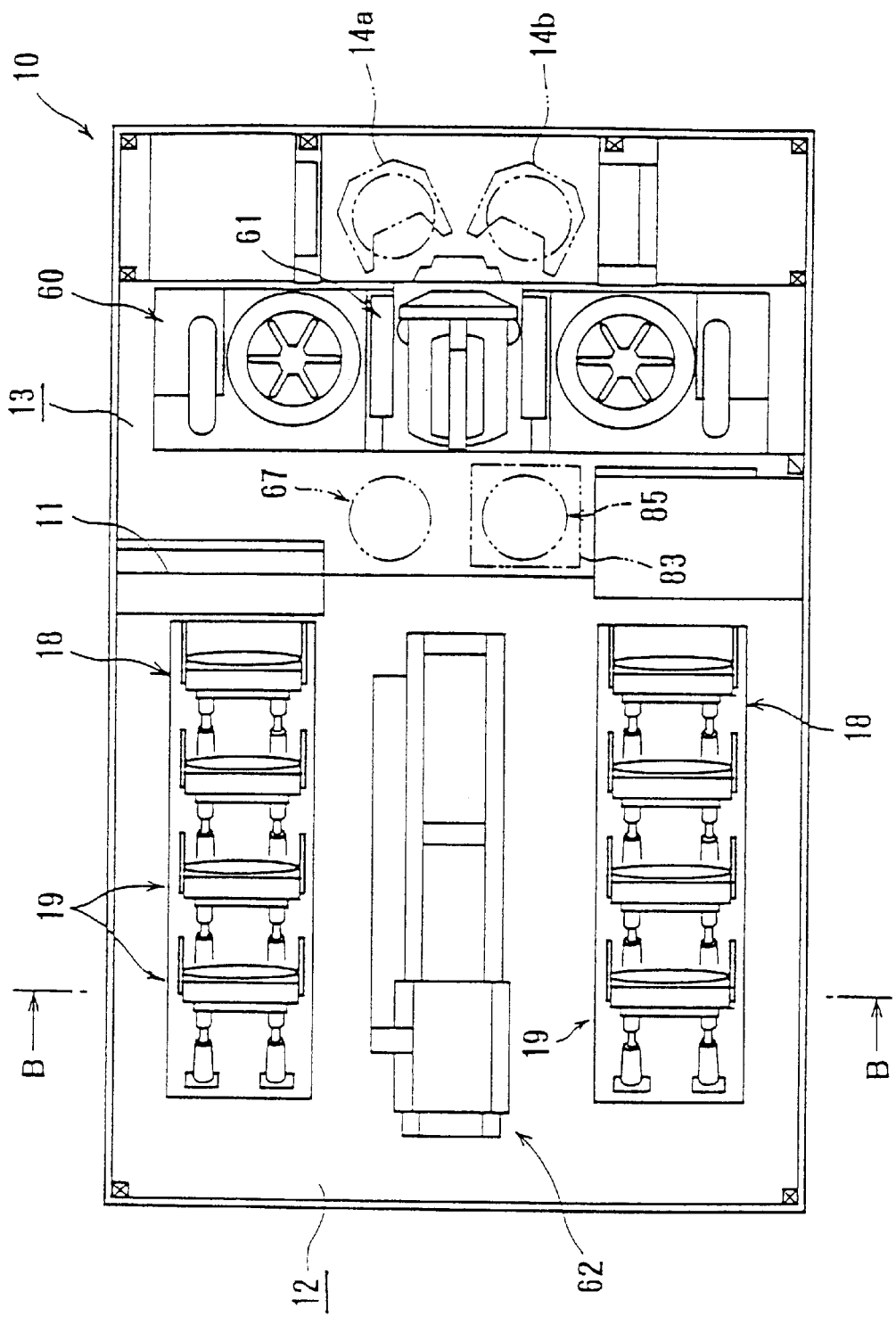
FIG. 8 is a plan view showing a layout of a plating apparatus according to another embodiment of the present invention.

As shown in FIGS. 6 and 7, each plating bath 19 includes a main section 50 having a cross-section in the shape of an open-ended rectangle, and a rectangularly shaped cover 51 capable of freely opening and closing over a front open portion of the main section 50. By closing the front open portion of the main section 50 with the cover 51, a plating chamber 52 is formed within the main section 50 to enable plating solution to flow in an up-down direction at an angle θ relative to a vertical plane. This angle θ is set within a range of 0–30°.

A packing seal 53 is mounted on a peripheral edge of the main section 50 in order to maintain a waterproof seal when the cover 51 is closed over the main section 50. The cover 51 is configured to detachably retain a wafer W on its underside surface. Further, a sensor (not shown) is provided on an inner side of the cover 51 to detect existence of the wafer W.

A depression 50a is formed in the main section 50. A flat anode 54 is mounted inside the depression 50a and parallel to the plating chamber 52. A shielding plate 55 formed of a dielectric plate is disposed at an open end of the depression 50a. An opening 55a is formed in an interior portion of the shielding plate 55 for adjusting an electric field on a plating surface of the wafer W.

An upper header 56 and a lower header 57 are mounted on upper and lower ends of the main section 50, respectively. The upper header 56 and lower header 57 are in fluid communication with the plating chamber 52 via a plurality of through-holes 56a and 57a, respectively. The upper header 56 and lower header 57 alternately introduce plating solution into the plating chamber 52 and discharge plating solution from the plating chamber 52.

With this construction, the cover 51 is opened to mount a semiconductor wafer W that is retained on a backside surface of the cover 51. Then, the cover 51 is closed. In this state, a plating solution is introduced either from the upper header 56 or lower header 57 into the plating chamber 52 and discharged from the other. A plating process is performed on the semiconductor wafer W, while flow of plating solution is reversed at fixed intervals. With this method, air bubbles can be easily dislodged from within fine grooves on a surface of the semiconductor wafer W, thereby increasing uniformity of a plating layer. At the same time, a required installation area for the plating baths 19 inside the apparatus is decreased, enabling more plating baths 19 to be disposed in a small equipment space.

In the plating baths 19, cleaning solution is introduced into the plating chamber 52 and discharged via the upper header 56 and lower header 57 for washing the semiconductor wafer W after the plating process. A gas for drying the semiconductor wafer W, such as $N_2$ gas, dry air, or the like is introduced and discharged in the same way, enabling the wafer W to be dried after a washing process.

Next, a second embodiment of the present invention will be described with reference to FIGS. 8–12. In this embodiment, rectangular equipment 10 is divided by partition 11 into contaminated zone 12 and clean zone 13. Air can be supplied and discharged independently to the contaminated zone 12 and the clean zone 13, and internal pressure of the clean zone 13 is set higher than pressure in the contaminated zone 12.

The clean zone 13 houses loading unit 14a and unloading unit 14b, two washing and drying units 60 for performing post-plating processes, and a conveying device (conveying robot) 61 for conveying wafers. The contaminated zone 12 houses preprocessing baths 18 for performing a pre-plating process on a wafer W, the plating baths 19 for performing a plating process, and a conveying device (conveying robot) 62 for conveying wafers.

Figure 9:
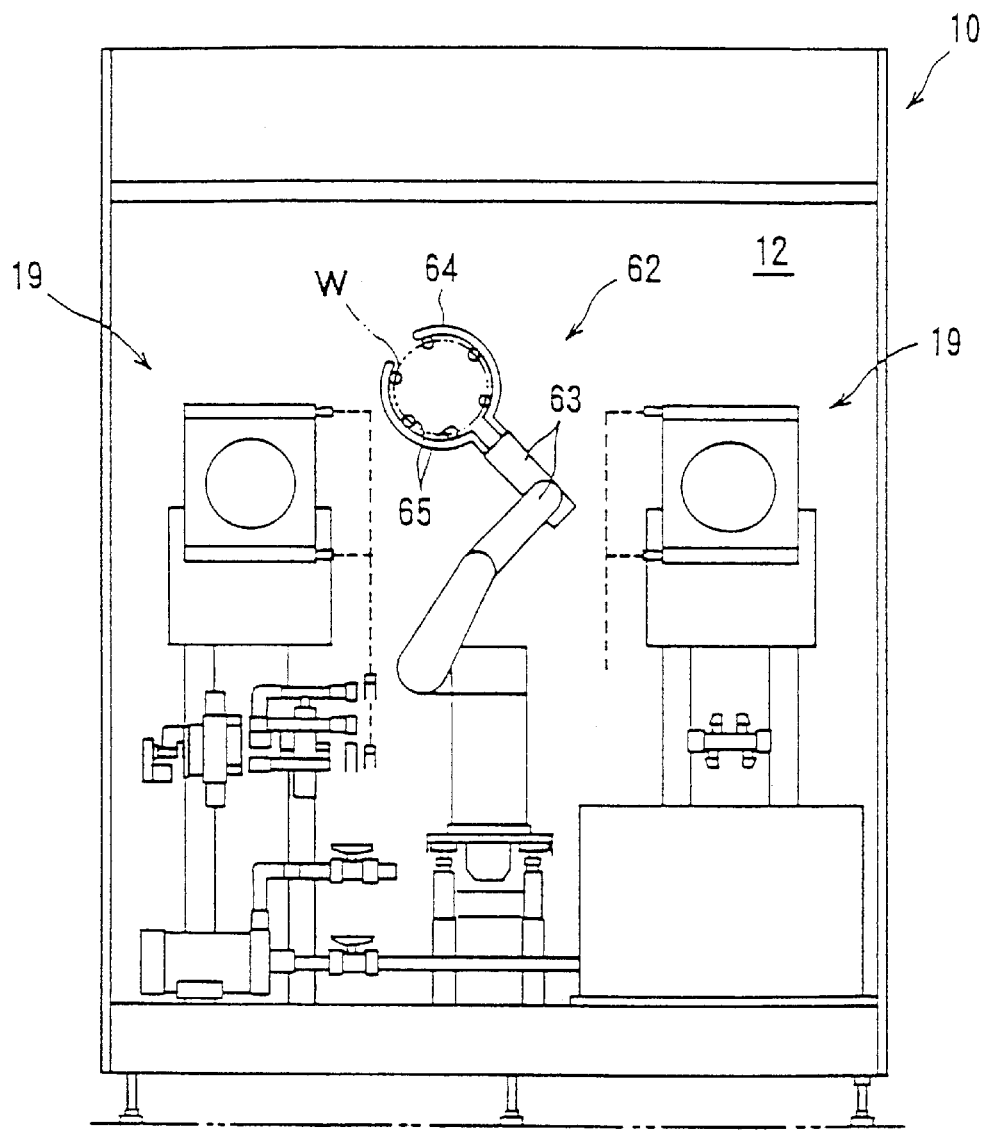
FIG. 9 is a cross-sectional view indicated by arrows B—B in FIG. 8.

The plating baths 19 and preprocessing baths 18 are constructed in the same way as described in the first embodiment. The conveying device 62 can be a six-axis robot, for example, as shown in FIG. 9. The conveying device 62 is provided with a plurality of arms 63, a freely opening and closing hand 64 mounted on an end of each arm 63, and a plurality of rollers 65 rotatably supported on an inner surface of the hand 64.

Figure 10:
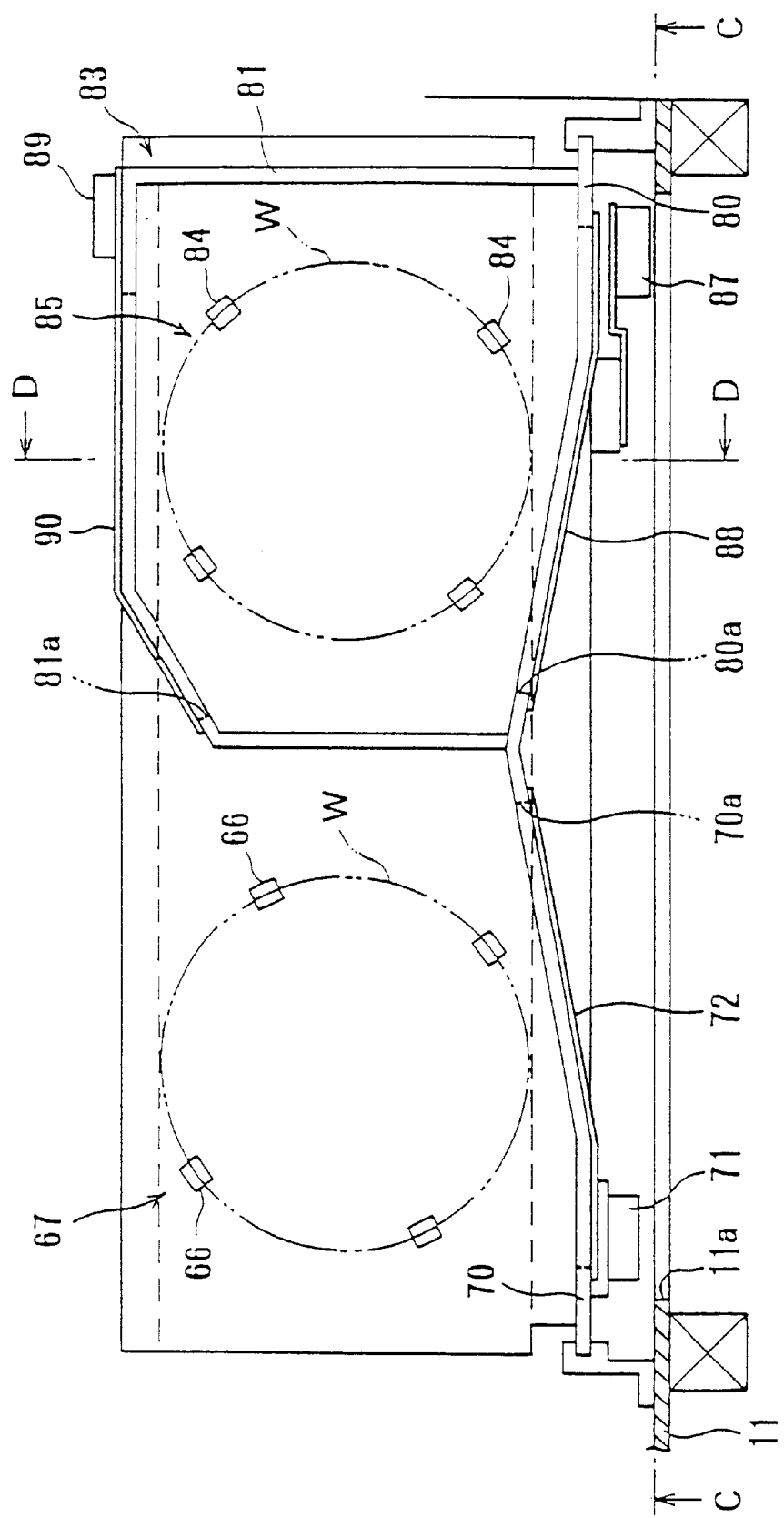
FIG. 10 is a plan view showing a layout of a loading stage and coarse washing chamber.
Figure 11:
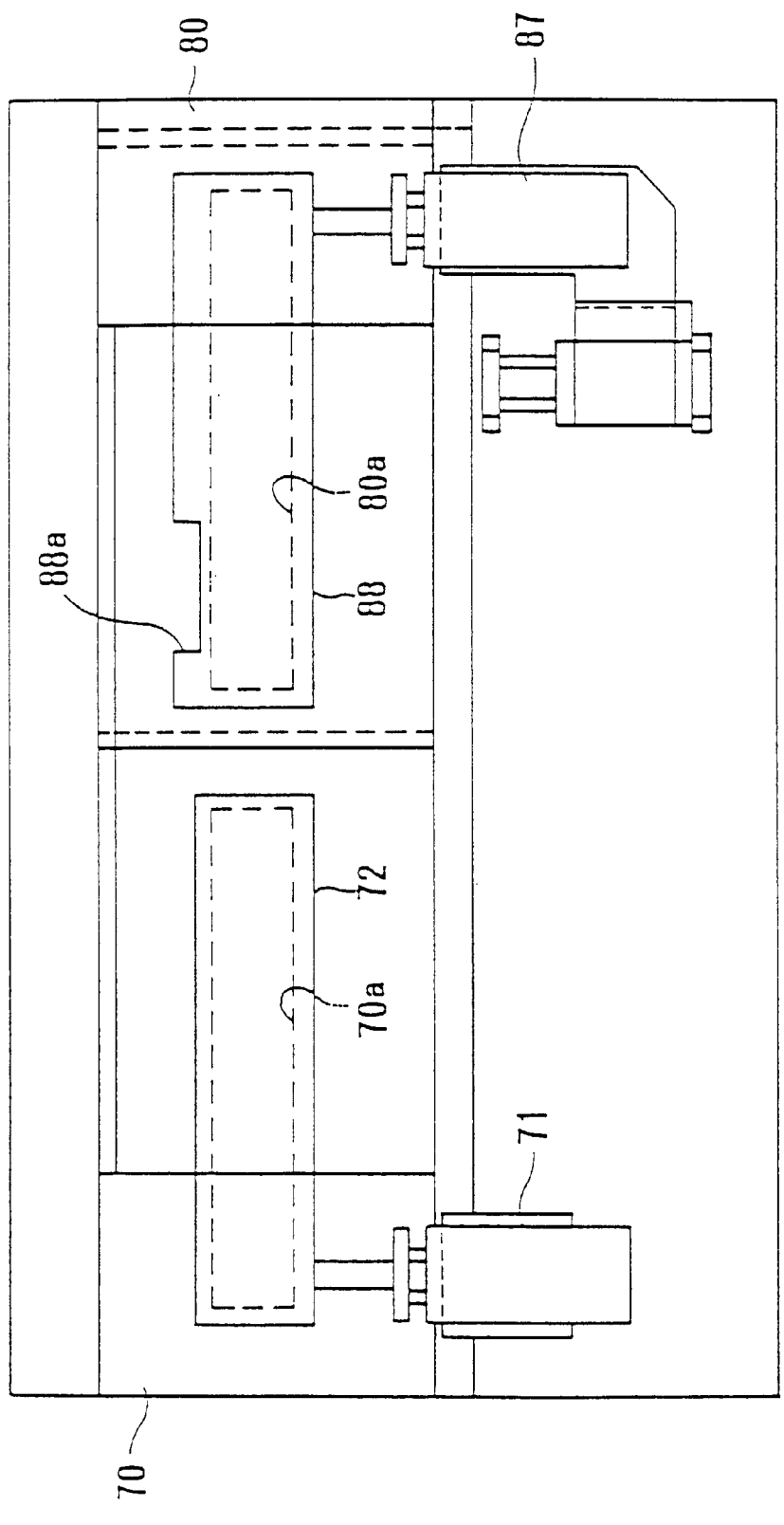
FIG. 11 is a cross-sectional view indicated by arrows C—C in FIG. 10.

A loading stage 67 is provided in the clean zone 13 adjacent to the partition 11. The loading stage 67 has a plurality (four as shown in FIG. 10) of support bases 66. With this construction, unprocessed wafers W retained by the conveying device 61 in the clean zone 13 are loaded onto the support bases 66 in the loading stage 67. Subsequently, the conveying device 62 in the contaminated zone 12 extracts a wafer W resting on the support bases 66.

A partitioning plate 70 (see FIG. 10) is disposed between the loading stage 67 and the partition 11. The partitioning plate 70 is provided with an opening 70a through which the hand 64 of the conveying device 62 is inserted, a cylinder 71, and a shutter 72 that opens and closes the opening 70a by virtue of the cylinder 71. The partition 11 is also provided with an opening 11a through which the hand 64 of the conveying device 62 passes.

With this construction, the shutter 72 is opened when the conveying device 62 in the contaminated zone 12 is extracting a wafer W from the support bases 66, and is closed at all other times.

A coarse washing chamber 83 is provided adjacent to the partition 11 and in a position parallel to the loading stage 67. The coarse washing chamber 83 has a box-shape and is formed from a rear partition plate 80 that is integrally formed with the partitioning plate 70, a front partition plate 81 surrounding a front part of the rear partition plate 80 in the shape of an open rectangle, and a ceiling plate 82. The coarse washing chamber 83 houses an unloading stage 85 with the same construction as the loading stage 67 described above. The unloading stage 85 includes a plurality (four in this diagram) of support bases 84.

Figure 12:
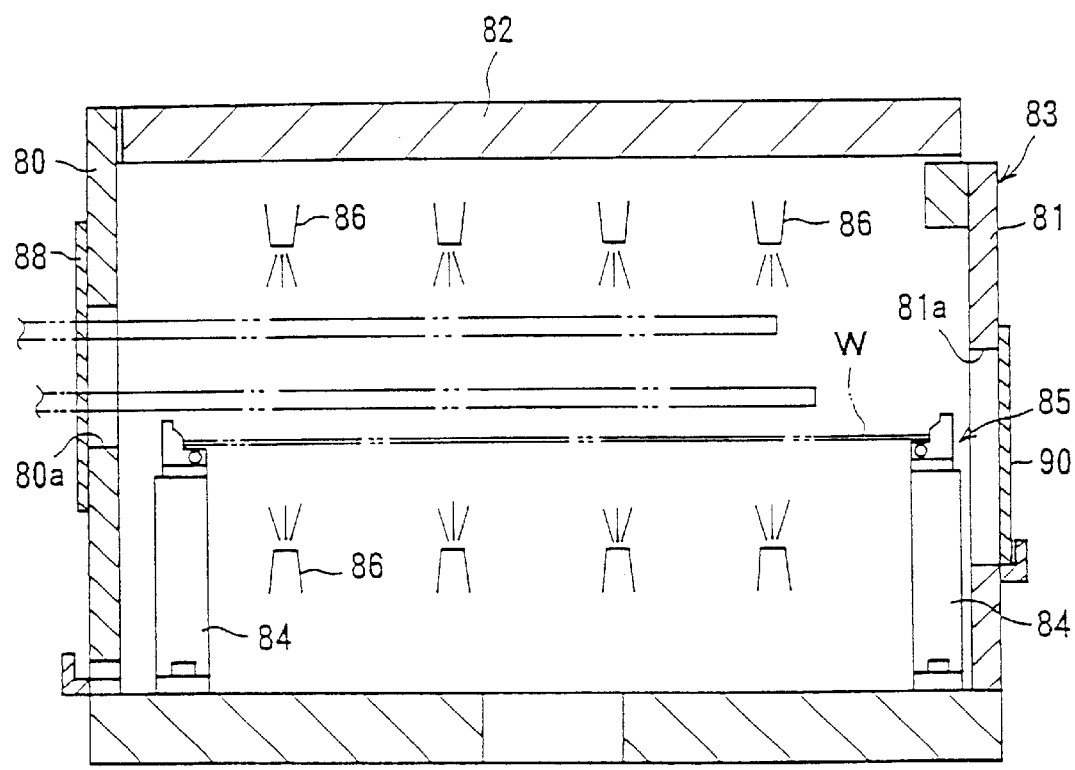
FIG. 12 is an enlarged cross-sectional view indicated by arrows D—D in FIG. 10.

A plurality of ejection nozzles 86 are provided on an inside top and bottom of the coarse washing chamber 83 for ejecting cleaning solution (see FIG. 12). The rear partition plate 80 is provided with an opening 80a through which the hand 64 of the conveying device 62 is inserted, a cylinder 87, and a shutter 88 for opening and closing the opening 80a by virtue of the cylinder 87. The front partition plate 81 is provided with an opening 81a through which a hand portion of the conveying device 61 passes, a cylinder 89, and a shutter 90 for opening and closing the opening 81a by virtue of the cylinder 89. The opening 11a formed in the partition 11 extends from a back of the loading stage 67 to a back of the coarse washing chamber 83 in order not to obstruct insertion of the hand 64.

A cutout portion 88a is provided on a top of the shutter 88 and is just large enough for the arm 63 of the conveying device 62 to pass through. With this construction, the hand 64 in the contaminated zone 12 is washed in the coarse washing chamber 83 along with a plated wafer W. Subsequently, a coarsely washed wafer W is placed on the support bases 84 of the unloading stage 85. After being coarsely washed again, the conveying device 61 in the clean zone 13 extracts the wafer W from the support bases 84.

In other words, the shutter 88 is opened and the hand 64 is inserted into the coarse washing chamber 83 while holding a plated wafer W. Next, the shutter 88 is raised and the ejection nozzles 86 eject cleaning solution toward the wafer W while the arm 63 is positioned in the cutout portion 88a, thereby washing both the hand 64 and wafer W. After being cleaned, the wafer W is placed on the support bases 84; the hand 64 is withdrawn from the coarse washing chamber 83; and the shutter 88 is closed.

Next, the ejection nozzles 86 eject cleaning solution toward the wafer W supported on the support bases 84 to coarsely clean the wafer W once again. Subsequently, the shutter 90 is opened. The hand portion of the conveying device 61 enters the coarse washing chamber 83, extracts the wafer W, and retracts from the coarse washing chamber 83. The shutter 90 is closed. In this way, the hand 64 is coarsely cleaned along with the plated wafer W, thereby preventing deposits of components in the plating solution from gradually building up on the hand 64. Further, the contamination on the hand 64 is not transferred to the conveying device 61 in the clean zone 13 and, therefore, does not contaminate the clean zone 13.

In the present embodiment, the clean zone 13 includes a coarse washing chamber 83 provided with a loading stage 67 and unloading stage 85. However, these components can be disposed in the contaminated zone 12, as well.

As described above, the substrate plating apparatus of the present invention is divided into a contaminated zone in which chemical mist and vapor caused by chemicals used in a plating process are dispersed, and a clean zone which requires a clean atmosphere. Both zones independently employ measures to prevent the deposition of particles on wafers. Accordingly, the substrate plating apparatus of the present invention can continuously plate wafers in the same apparatus while preventing deposition of chemical mist and vapor on wafers after they have been processed.

Moreover, since the hand of the conveying device disposed in the contaminated zone is coarsely washed while holding a wafer that has been plated, contaminants from the hand will not be transferred to the other conveying device. Therefore, the present invention can prevent deposits from components in the plating solution from building up on the hand in the contaminated zone, and can prevent contaminants from the hand affecting the conveying device in the clean zone.

Further, by arranging a plurality of plating baths each with a plating chamber through which plating solution flows in an up-down direction parallel to a plating surface, air bubbles can be easily dislodged from within fine grooves in the plating surface of the semiconductor wafer W, thereby increasing uniformity of a plating layer and preventing particles from being deposited on the plating surface. At the same time, a required installation area for the plating baths inside the apparatus is decreased, enabling more plating baths to be disposed in a small equipment space.

Figure 13:
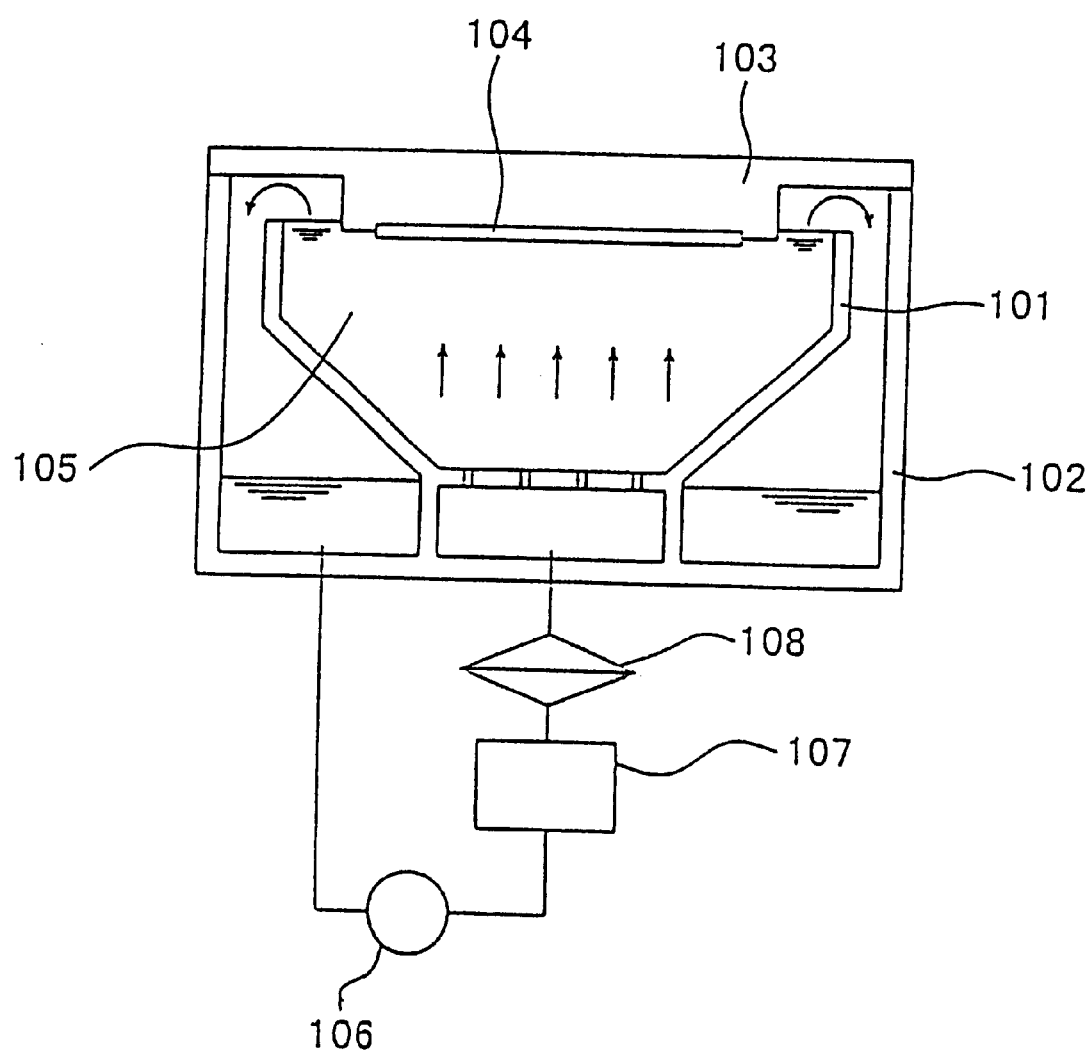
FIG. 13 is a cross-sectional view showing a construction of a conventional plating bath.

Next, structure of the plating bath according to the present invention shown in FIGS. 6 and 7 will be described. FIG. 13 shows a conventional construction of this type of plating apparatus. The plating apparatus includes a plating bath 101 and an external bath 102 on the outside of the plating bath 101. A jig 103 is disposed on top of the plating bath 101 and a substrate 104 is mounted on a bottom of the jig 103 with its plating surface facing downwardly. A plating solution 105 flows from a bottom of the plating bath 101 toward the plating surface of the substrate 104 to plate the substrate 104. The plating solution 105 overflowing from the plating bath 101 is collected in the external bath 102. A pump 106 circulates plating solution 105 from the external bath 102 back to the plating bath 101 through a constant-temperature unit 107 and a filter 108.

However, positioning the plating surface of the substrate 104 to be downwardly facing in this construction is not conducive for introducing plating solution into fine holes in the plating surface. It is also difficult for air bubbles to escape from the holes with smallest diameters to allow fluid to enter thereinto. Further, since the flow of the plating solution 105 is directly perpendicular to the plating surface of the substrate 104, the thickness of the plating layer will be different between a center of the substrate 104 and an outer periphery thereof, thereby forming a non-uniform layer thickness. As a diameter of wafers becomes large, this problem becomes more remarkable.

Figure 14:
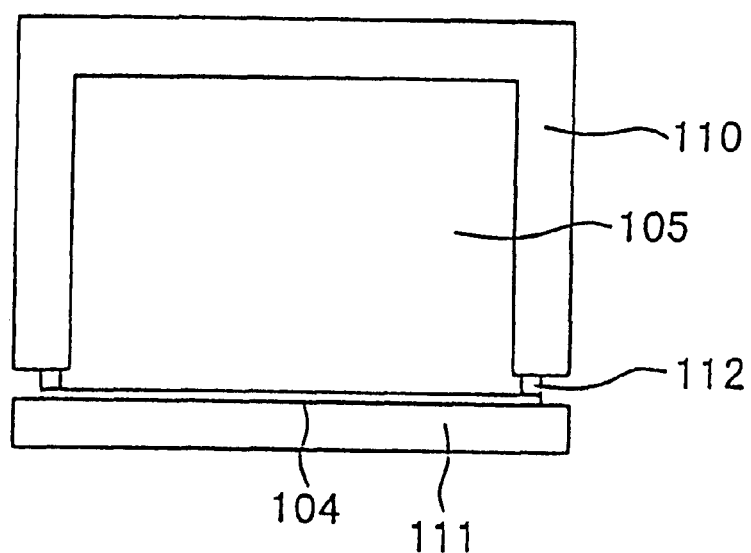
FIG. 14 is a cross-sectional view showing a construction of a conventional plating bath.

There are also plating apparatus in which a plating surface of substrate 104 faces upwardly, as shown in FIG. 14, in order to allow bubbles to escape more easily from holes in the plating surface. In this method, however, particles accumulating on walls of plating bath 110 and the like are more susceptible to be deposited onto the plating surface of the substrate 104. The plating apparatus shown in FIG. 14 also includes a jig 111 on which the substrate 104 is mounted, and a seal 112.

Figure 15A:
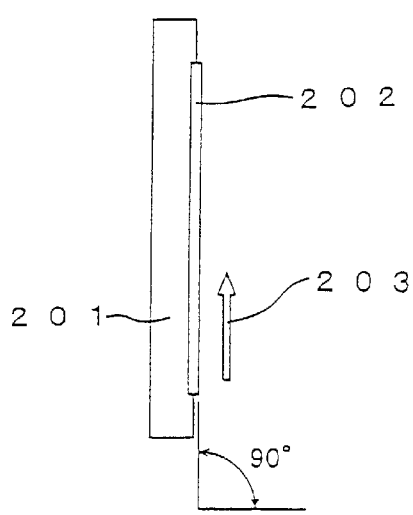
FIGS. 15A–15C are views, which explain a concept of a plating bath according to the present invention.
Figure 15B:
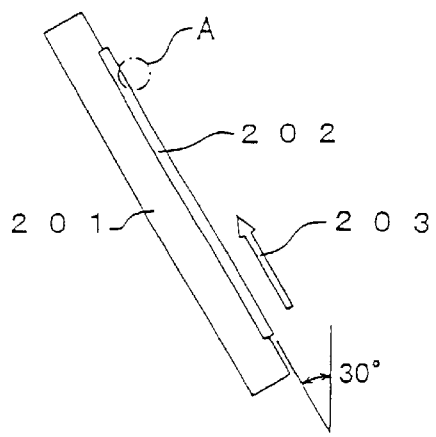
Figure 15C:
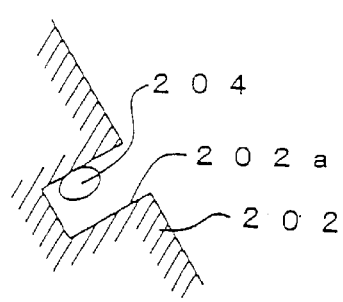

FIGS. 15A–15C are explanatory diagrams showing the concept of the plating bath according to the present invention. As shown in FIG. 15A, the plating bath includes a plating jig 201 and a substrate 202 mounted on the jig 201, with a plating surface in a vertical orientation. A plating solution 203 flows parallel to the plating surface from bottom to top.

By supplying the plating solution 203 in a flow parallel to the plating surface of the substrate 202 within a hermetically sealed plating bath, it is possible to form a uniform plating layer on the plating surface of the substrate 202. An approximately vertical orientation of the substrate 202 prevents a problem of particles being deposited in the plating layer on the plating surface of the substrate 202. It is also possible to prevent such particle deposition by tilting the substrate slightly from vertical, as shown in FIG. 15B. The substrate shown in FIG. 15B is tilted with its plating surface facing upwardly. However, it is also possible to tilt the substrate so its plating surface is facing downwardly with the same effects.

By tilting the substrate 202 from a vertical plane so that its plating surface is facing upwardly, as shown in FIG. 15B, an air bubble 204 can easily escape from a hole 202a formed in the substrate 202, as shown in FIG. 15C. Hence, particles will not be deposited on the plating surface of the substrate 202 when the substrate 202 is tilted relative to the vertical plane, as shown in FIG. 15B. Further, by flowing the plating solution 203 parallel to the plating surface of the substrate 202, it is possible to form a plating layer having uniform thickness on the plating surface of the substrate 202 without being affected by size of the substrate 202.

It is desirable to tilt the substrate at an angle of 0–45° from the vertical plane, whether facing upwardly or facing downwardly, in order to best prevent particle deposition and allow air bubbles to escape. If the substrate is facing upwardly, it is even more desirable to set the angle of tilt from the vertical plane to 0–30°. It is effective to slant the substrate with the plating surface facing downwardly when it is possible to avoid adverse effects of air bubbles by controlling pressure and flow of the plating solution and the like.

Since the plating solution flows parallel to the plating surface in a sealed space, it is possible to adjust pressure of the plating solution, as well as direction and rate of flow of the plating solution. With this method, a plating layer can be densely formed in fine grooves formed in the plating surface of the substrate.

Figure 16:
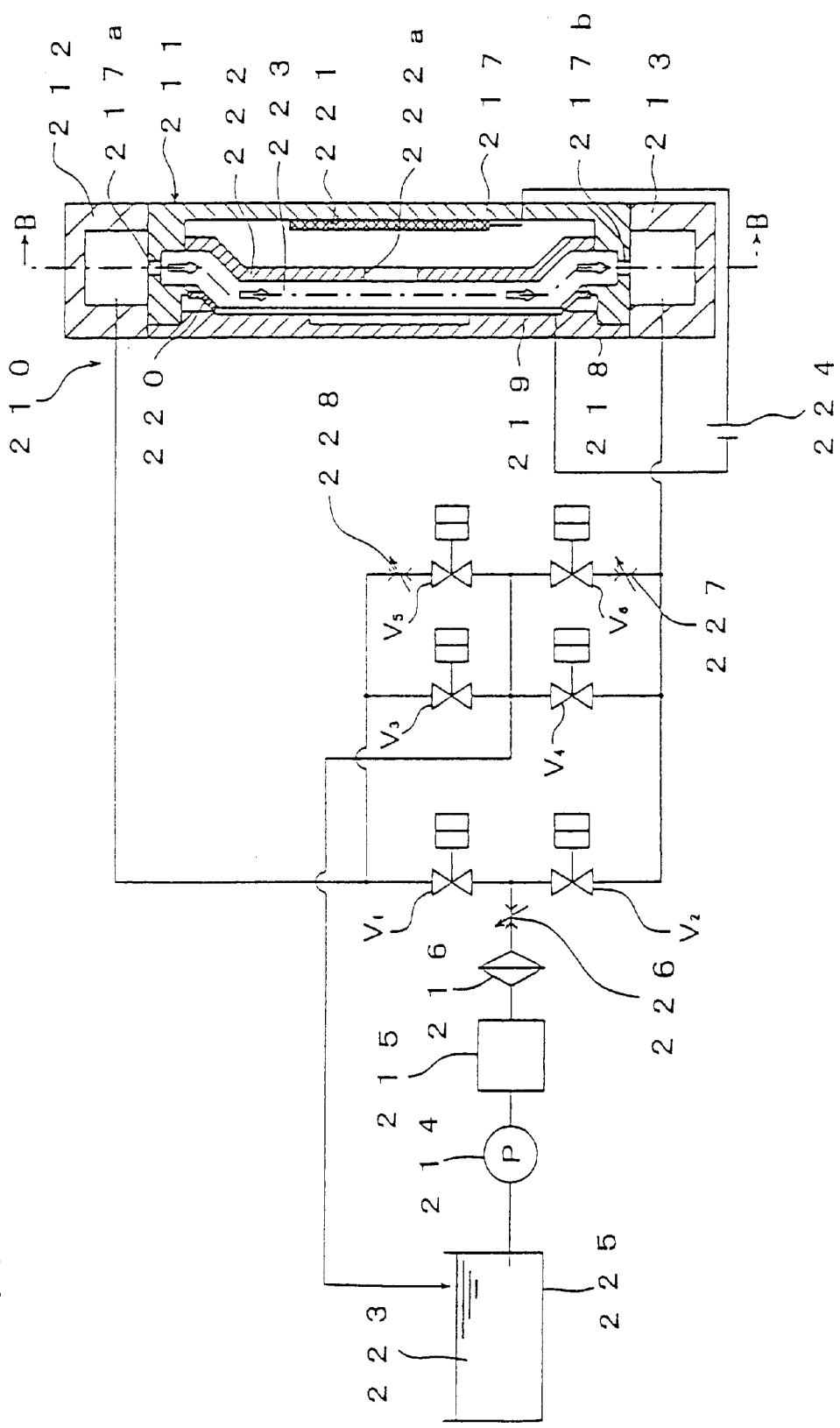
FIG. 16 shows an example of a construction of a plating apparatus having a plating bath according to the present invention.
Figure 17:
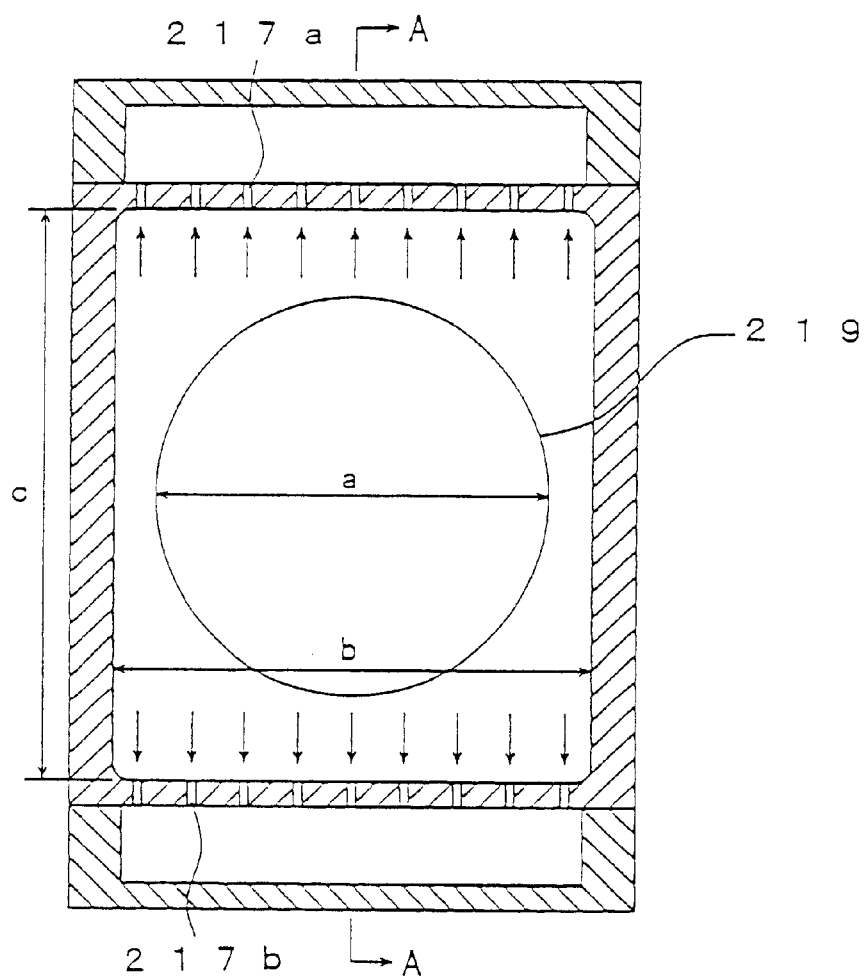
FIG. 17 is a front cross-sectional view of the plating bath in FIG. 16 indicated by arrows B—B in FIG. 16.

FIG. 16 shows an example construction of a plating apparatus 210 according to the present invention. FIG. 17 shows a cross-section along a front part of the plating apparatus indicated by the arrows B—B in FIG. 16. The plating apparatus 210 includes a plating bath 211, an upper header 212 and a lower header 213 disposed on a top and bottom of the plating bath 211, respectively, a pump 214, a constant-temperature unit 215, and a filter 216. The plating bath 211 is formed of a main bath section 217 having a cross section shaped as an open-ended rectangle, and a flat side plate 218. A substrate 219 is mounted on the side plate 218. A packing 220 is provided to sealingly contact a peripheral edge of the substrate 219 when the side plate 218 sealingly contacts an opening portion of the main bath section 217. A flat anode 221 is provided on the main bath section 217 and disposed parallel to the substrate 219. The plating bath 211 shown in FIG. 16 is the cross section indicated by the arrows A—A in FIG. 17.

A shielding plate 222 formed of a dielectric plate is disposed between the anode 221 and substrate 219. A hole 222a is formed in a central portion of the shielding plate 222 opposite a plating surface of the substrate 219. The hole 222a serves to adjust an electric field that has the effect of adjusting an electric field on the plating surface of the substrate 219. The substrate 219 and shielding plate 222 are positioned parallel to each other, forming a space therebetween, through which a plating solution 223 flows. The flow path is formed in the space such that the plating solution 223 flows parallel in relation to the plating surface of the substrate 219. A width "b" and length "c" of the flow path of the plating solution is larger than a diameter "a" of the substrate 219. A plurality of holes 217a and 217b are formed in a top and bottom of the main bath section 217 to allow plating solution to flow through the main bath section 217. A DC power source 224 applies a prescribed voltage between the anode 221 and substrate 219.

When plating solution flows in a forward direction through the plating bath 211 in the plating apparatus 210 described above, valves V1 and V4 are opened and valves V2, V3, V5, and V6 are closed. Plating solution 223 stored in a circulating tank 225 is transferred by the pump 214 to the upper header 212 via the constant-temperature unit 215, filter 216, a current regulating valve 226, and the valve V1. The plating solution 223 passes through the plating bath 211, the lower header 213, and the valve V4 and returns again to the circulating tank 225. Within the plating bath 211, the plating solution 223 flows through the holes 217a of the main bath section 217, the space formed between the substrate 219 and shielding plate 222, and the holes 217b on the bottom of the main bath section 217. The power source 224 applies a prescribed voltage between the anode 221 and substrate 219. Accordingly, it is possible to adjust the direction, rate of flow and pressure of the plating solution to desirable values.

In the plating apparatus described above, the substrate 219 is fixed to the side plate 218 of the plating bath 211. Therefore, by positioning the plating bath 211 along a vertical plane or tilted from the vertical plane, the substrate 219 will also be positioned accordingly. A desirable tilt angle is 0–45° or even more desirable 0–30°, but is not limited to this range. Accordingly, air bubbles can easily escape from the fine holes formed in the plating surface and particles do not deposit on the surface of the wafer. Further, when the plating solution 223 flows in the gap between the substrate 219 and shielding plate 222, the flow is parallel in relation to the plating surface of the substrate 219, as described above. Accordingly, a plating layer of uniform thickness can be formed on the plating surface of the substrate 219 without being influenced by the size of the substrate 219. Also, the width "b" and length "c" of the plating solution flow path are larger than the diameter "a" of the substrate 219. Accordingly, flow of the plating solution is uniform over the entire plating surface of the substrate 219, thereby forming a plating layer of uniform thickness on the plating surface.

In the plating apparatus described above, the flow of the plating solution 223 within the plating bath 211 is reversed at a prescribed time. In other words, when valves V2 and V3 are opened, valves V1, V4, V5, and V6 are closed. Hence, the pump 214 supplies the plating solution 223 from the circulating tank 225 to the lower header 213 via the constant-temperature unit 215, filter 216, current regulating valve 226, and valve V2. After passing through the plating bath 211, the plating solution 223 passes through the upper header 212 and the valve V3 before returning to the circulating tank 225.

An even more uniform plating thickness can be formed on the surface of the substrate 219 by reversing the flow of the plating solution 223 in the plating bath 211 at a prescribed time. This method encourages the plating solution 223 to flow in and out of the fine holes or pits formed in the plating surface of the substrate 219, thereby forming a uniform plating layer over inner surfaces of the fine holes.

In the plating apparatus 210 having a construction described above, pressure inside the plating bath 211 is increased and decreased at a prescribed time. In other words, when the plating solution 223 is flowing in the forward direction within the plating bath 211, the open valve V4 on an exit side of the plating bath 211 is closed at a specific time, while simultaneously the closed valve V6 is opened. At this time, a flow adjusting valve 227 disposed in the valve V6 line adjusts the flow through this line to be smaller than the flow through the valve V4 line. As a result, pressure in this line rises when the flow is switched to the valve V6 line.

Hence, by opening and closing the valves V4 and V6 at a prescribed time when the plating solution 223 is flowing in the forward direction, pressure within the plating bath 211 can be increased and decreased. Further, a flow regulating valve 228 is also provided in the valve V5 line. The flow regulating valve 228 adjusts the flow through this line to be smaller than that through the valve V3 line. By opening and closing the valves V3 and V5 at prescribed times when the plating solution 223 is flowing in the reverse direction, it is possible to raise and lower pressure within the plating bath 211. By raising and lowering the pressure within the plating bath 211, air bubbles within fine holes in the plating surface of the substrate 219 can more easily escape and plating solution can more easily enter the fine holes, thereby forming a plating layer of uniform thickness over the entire plating surface.

When $CuSO_4$ solution is used as the plating solution 223, the solution generates a large amount of copper sulfate crystals when the solution dries. These crystals can have an adverse affect on the plating process as particles. Therefore, the plating apparatus with the construction described above is configured to discharge the plating solution 223 from the plating bath 211 after performing the plating process, and introduce wash water into the plating bath 211 and the upper header 212 and lower header 213 to flush an inside of these components. This process can prevent particles from generating and thus eliminate adverse effects that particles have on the plating process.

After discharging the wash water, a gas such as $N_2$ gas or dry air capable of drying the plating bath 211, upper header 212 and lower header 213 is introduced into the plating bath 211. By drying the substrate 219 and the inside of the plating bath 211, contaminants within the plating bath 211 are reduced and the plating surface of the substrate 219 is dried, thereby making it difficult for particles to be deposited onto the plating surface of the substrate 219.

Figure 18A:
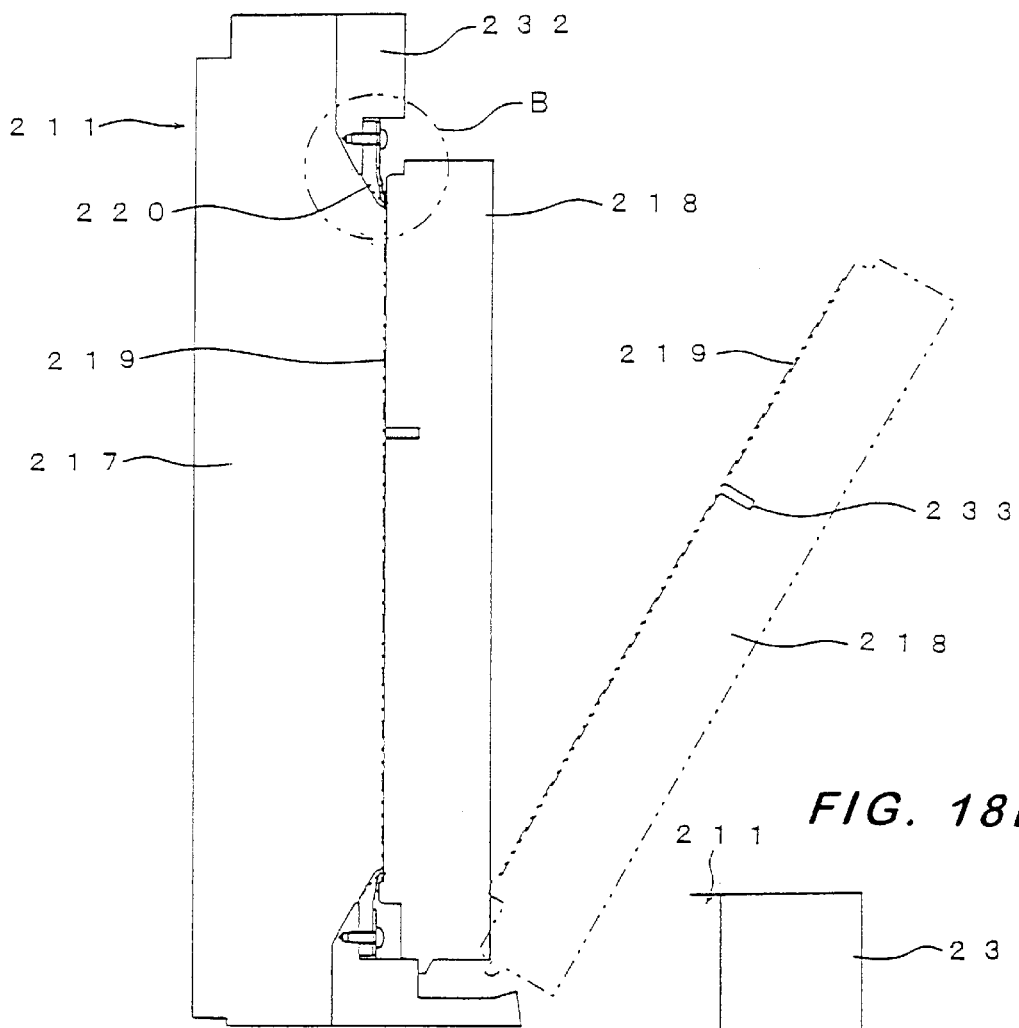
FIGS. 18A–18B show another example of a construction of a plating bath used in the plating apparatus of the present invention, with FIG. 18A being a side cross-sectional view of the plating bath and FIG. 18B being an enlarged view of the area indicated by B in FIG. 18A.
Figure 18B:
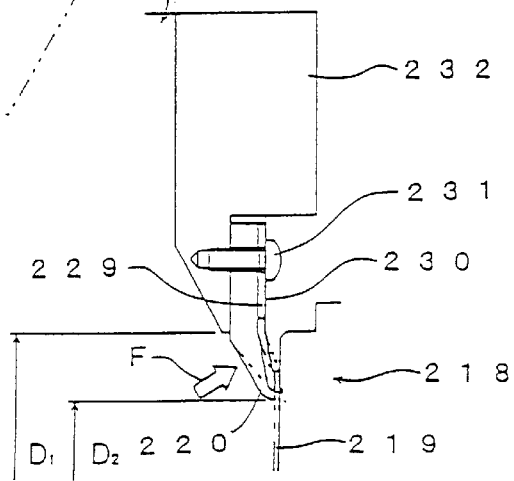
Figure 19:
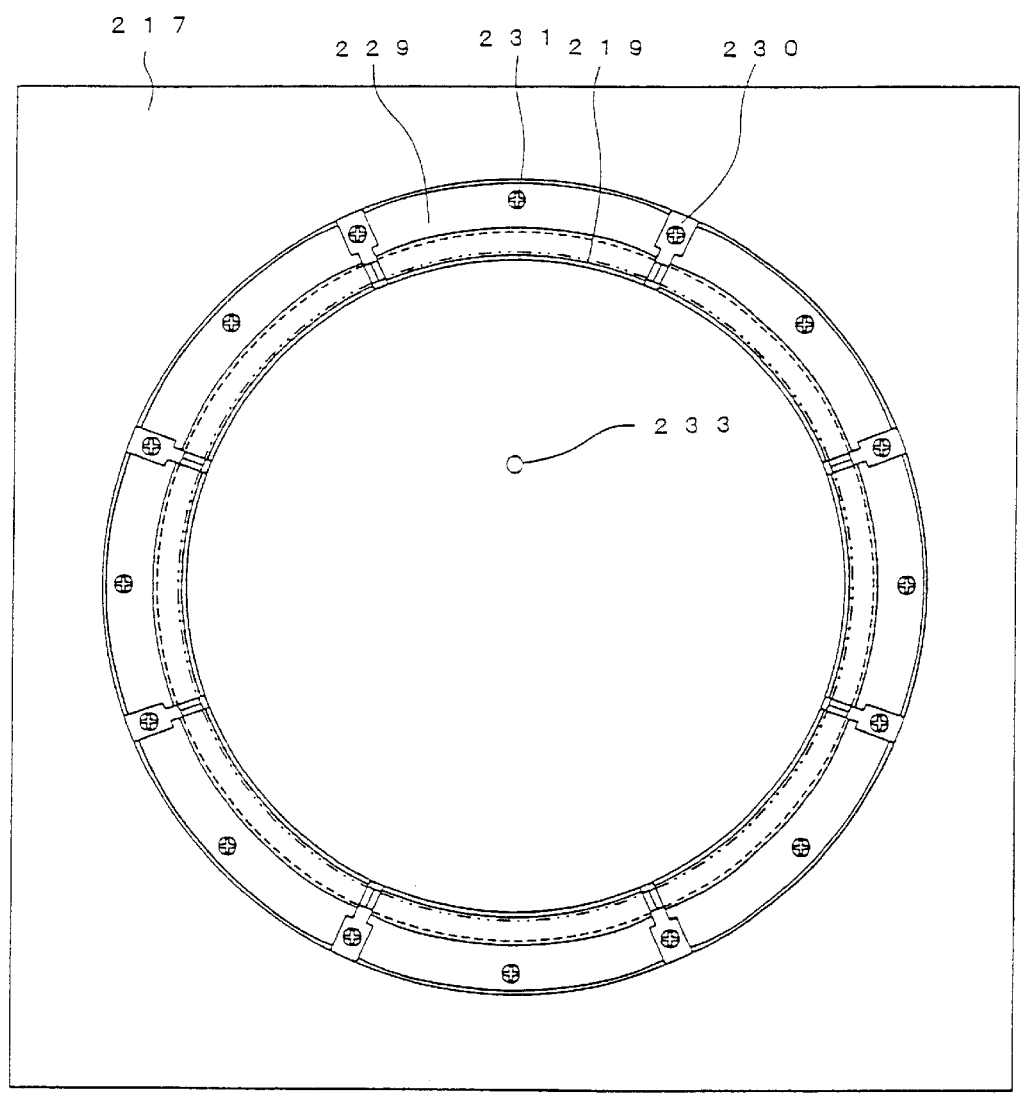
FIG. 19 is a plan view showing a construction of a side plate used in the plating bath of the plating apparatus shown in FIG. 18.

FIGS. 18A and 18B show the construction of a plating bath according to another embodiment of the present invention. FIG. 18A shows a side cross-sectional view of plating bath 211. FIG. 18B shows an enlarged view of the circled area B shown in FIG. 18A. FIG. 19 is a plan view showing the construction of side plate 218. The plating bath 211 is comprised of the main bath section 217 having a cross-section shaped like an open-ended rectangle, and a flat side plate 218. An internal portion of the plating bath 211 is similar to that shown in FIG. 16 and has been omitted here. Substrate 219 can be mounted on a top surface of the side plate 218 by a wafer mounting mechanism described later. Annular packing 220 is fixed to the main bath section 217 by a ring 229 and screws 231 that pass through a bracket 232 and attach to holes formed in the main bath section 217 opposing the side plate 218. Electrodes (contact plates) 230 are provided at regular intervals along the ring 229 and fixed together with the ring 229 by the screws 231.

After mounting the substrate 219 onto the side plate 218, the side plate 218 is closed via a hinge mechanism, described later, to contact an open portion of the main bath section 217. By doing so, an inner edge of the packing 220 sealingly contacts a top surface of a peripheral edge of the substrate 219, thereby forming a space between shielding plate 222, substrate 219, and packing 220 through which plating solution 223 flows. At the same time, ends of the electrodes 230, which serve as a cathode, contact the conducting portion of the substrate 219. At this time, a plating surface of the substrate 219 is tilted from a vertical plane within a range of 30° with the plating surface facing upwardly. A sensor 233 is provided at a prescribed position on the side plate 218 to detect whether or not the substrate 219 is mounted on the side plate 218.

As shown by the dotted line in FIG. 18B, an inner edge portion of the packing 220 protrudes in a funnel shape external to the main bath section 217 (protrudes at a slant externally). When the top surface of the peripheral edge of the substrate 219 contacts and presses against this inner edge portion, the packing 220 is deformed to the position described by a solid line in the diagram. By designating the pressure within the plating bath 211 "P", inner diameter of the bracket 232 "$D_1$", and inner diameter of the packing 220 "$D_2$", a force pushing the packing 220 on the substrate 219 can be calculated by $P \times (D_1^2 - D_2^2)\pi/4$. This force improves sealing ability of the packing 220. By setting an internal force of the plating bath 211 higher than an external force (atmospheric pressure), an end of the inner peripheral edge on the packing 220 presses forcefully against the peripheral edge of the substrate 219, thereby forming a strong seal.

As shown in FIGS. 18A, 18B, and 19, the electrodes 230 are provided on an outside of the packing 220. Since the electrodes 230 contact the substrate 219 at a point outside of the sealed area, where the inner peripheral edge of the packing 220 contacts the peripheral edge of the substrate 219, the electrodes 230 do not contact the plating solution and are not plated. Therefore, it is possible to prevent particles from being generated from the electrodes 230. At the same time, the electrodes 230 can maintain stable conductivity.

Figure 20:
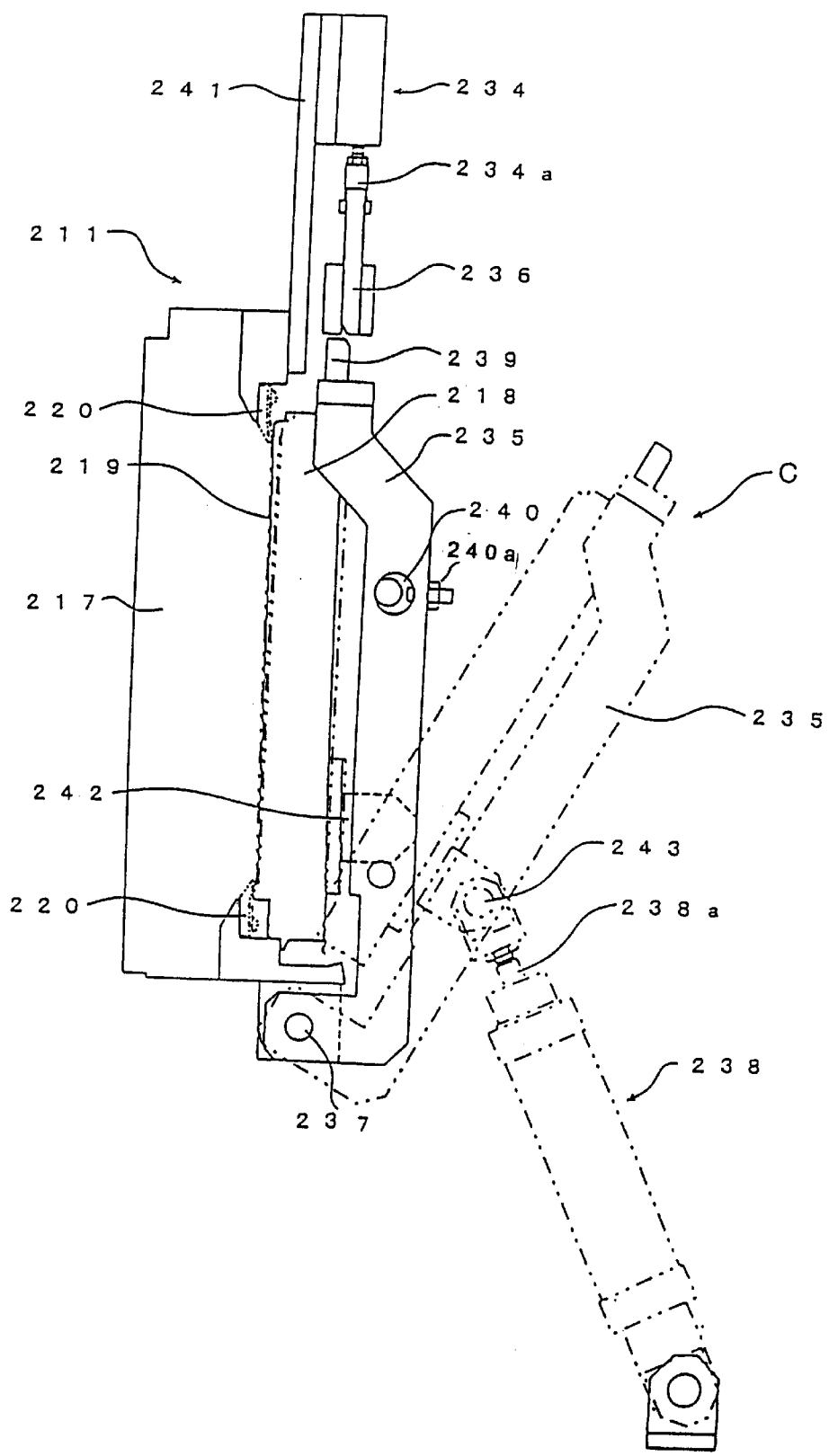
FIG. 20 shows a construction of a cover mechanism in a first position on the plating bath used in the plating apparatus of FIG. 18.
Figure 21:
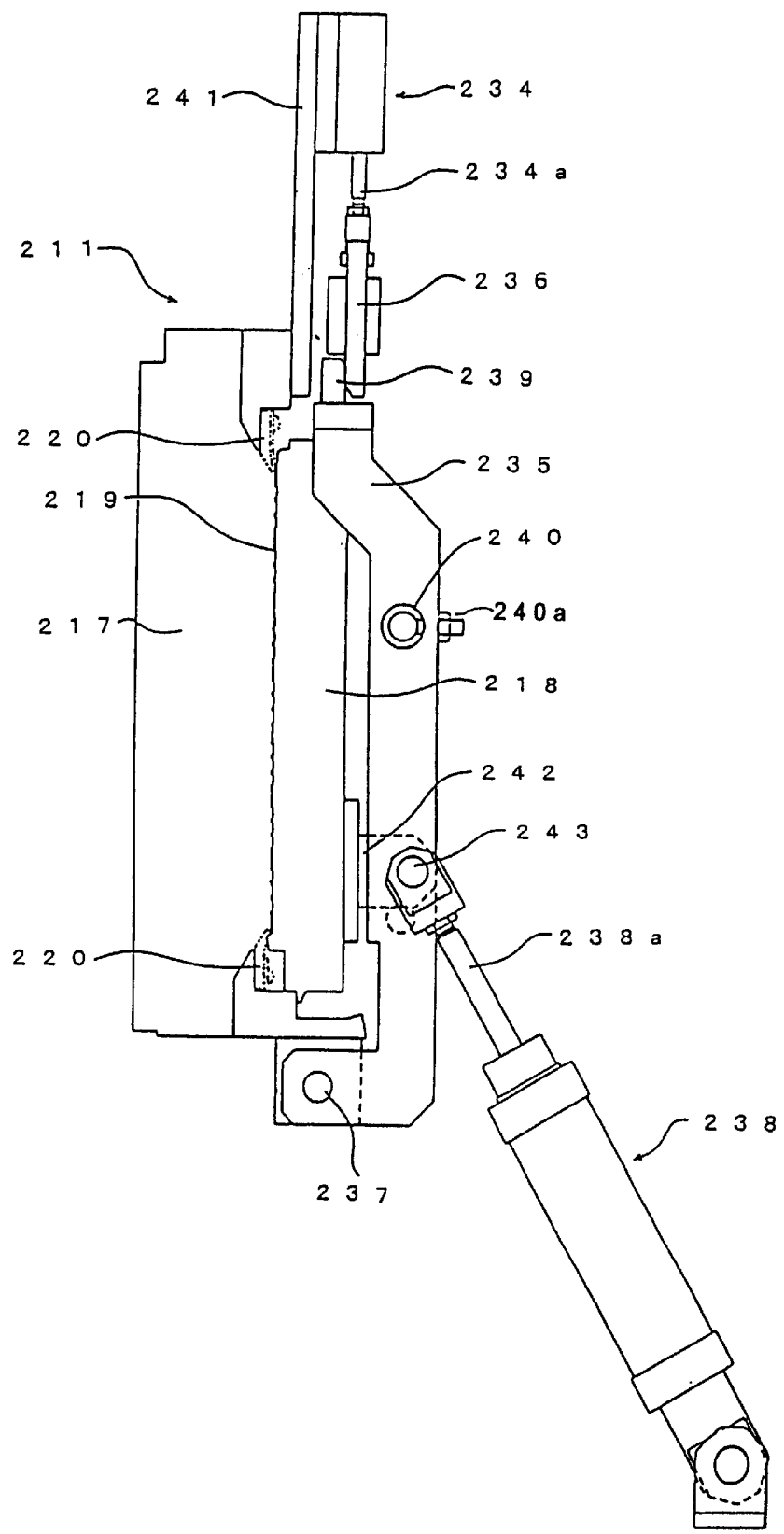
FIG. 21 shows a construction of the cover mechanism in a second position on the plating bath used in the plating apparatus of FIG. 18.

FIGS. 20 and 21 show a construction of a bath cover mechanism for the plating bath 211. The bath cover mechanism includes a cover member 235. The side plate 218 is pivotally supported on the cover member 235 by a bracket 242 and a pin 243. A bottom end of the cover member 235 is pivotally supported on a bottom end of the main bath section 217 by a hinge mechanism 237. A cylinder 238 is provided for opening and closing the cover member 235 and includes a piston 238a. The end of the piston 238a is pivotally supported on the pin 243. By operating the cylinder 238, the piston 238a advances and retracts, causing the cover member 235 to rotate about the hinge mechanism 237. The side plate 218 supported on the cover member 235 rotates to open and close the plating bath 211.

A support member 241 is attached to a top portion of the main bath section 217. A locking cylinder 234 is provided on the support member 241 and has a piston 234a. A locking member 236 is coupled with a piston 234a. Operating the cylinder 238 to advance the piston 238a rotates the cover member 235 and side plate 218 until the side plate 218 contacts the main bath section 217. By operating the locking cylinder 234, the locking member 236 protrudes and engages with a locking protrusion 239 provided on top of the cover member 235, thereby locking the cover member 235 and side plate 218, as shown in FIG. 21.

A hinge mechanism 240 links the side plate 218 and cover member 235, and functions to adjust a margin between the the side plate and cover member to a prescribed amount. This amount of margin is adjusted by a nut 240a to set a distance from a point that the substrate 219 contacts the packing 220 until the side plate 218 is locked.

Figure 22:
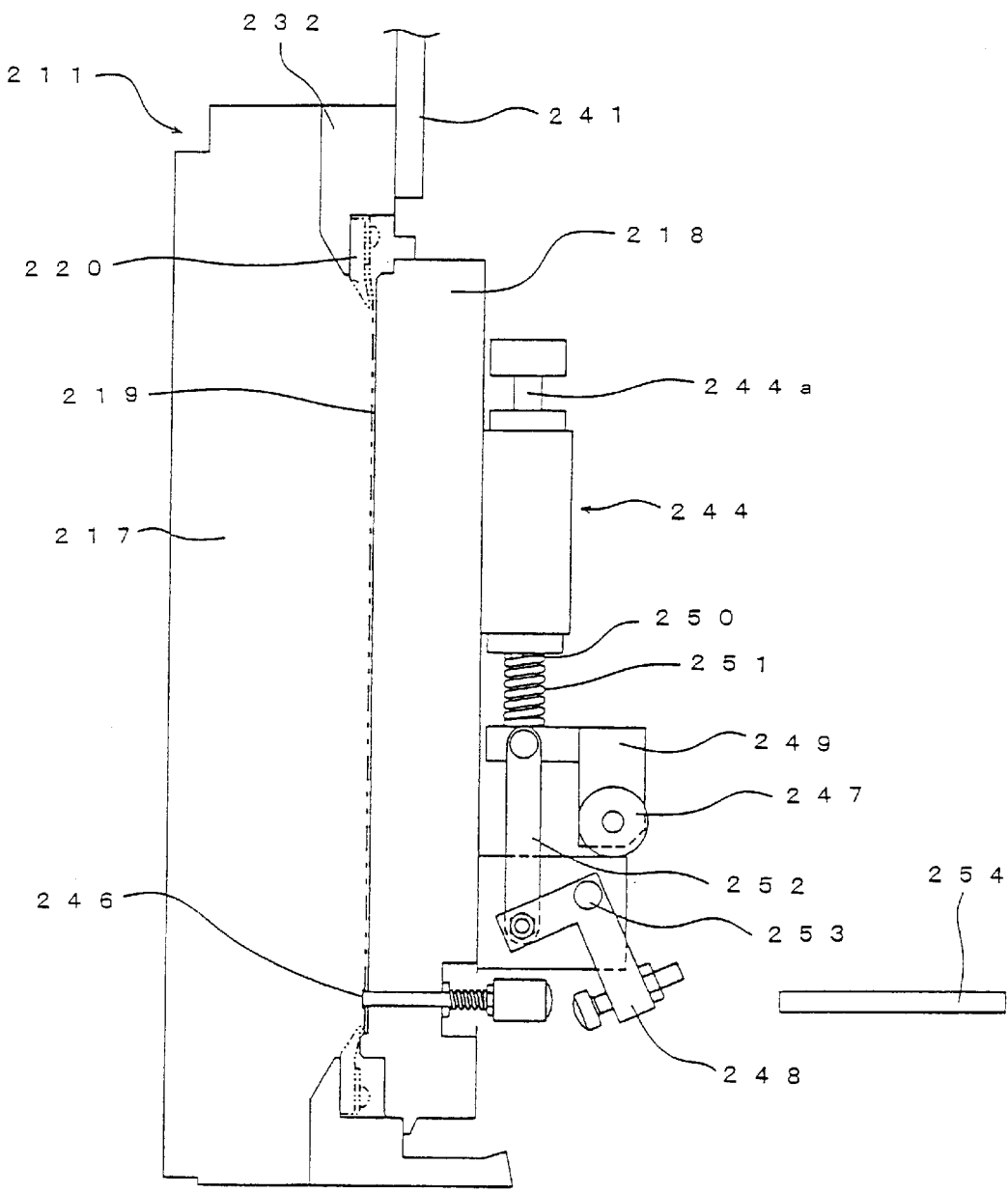
FIG. 22 shows a construction of a wafer mounting mechanism in a first position used in the plating apparatus of FIG. 18.
Figure 23:
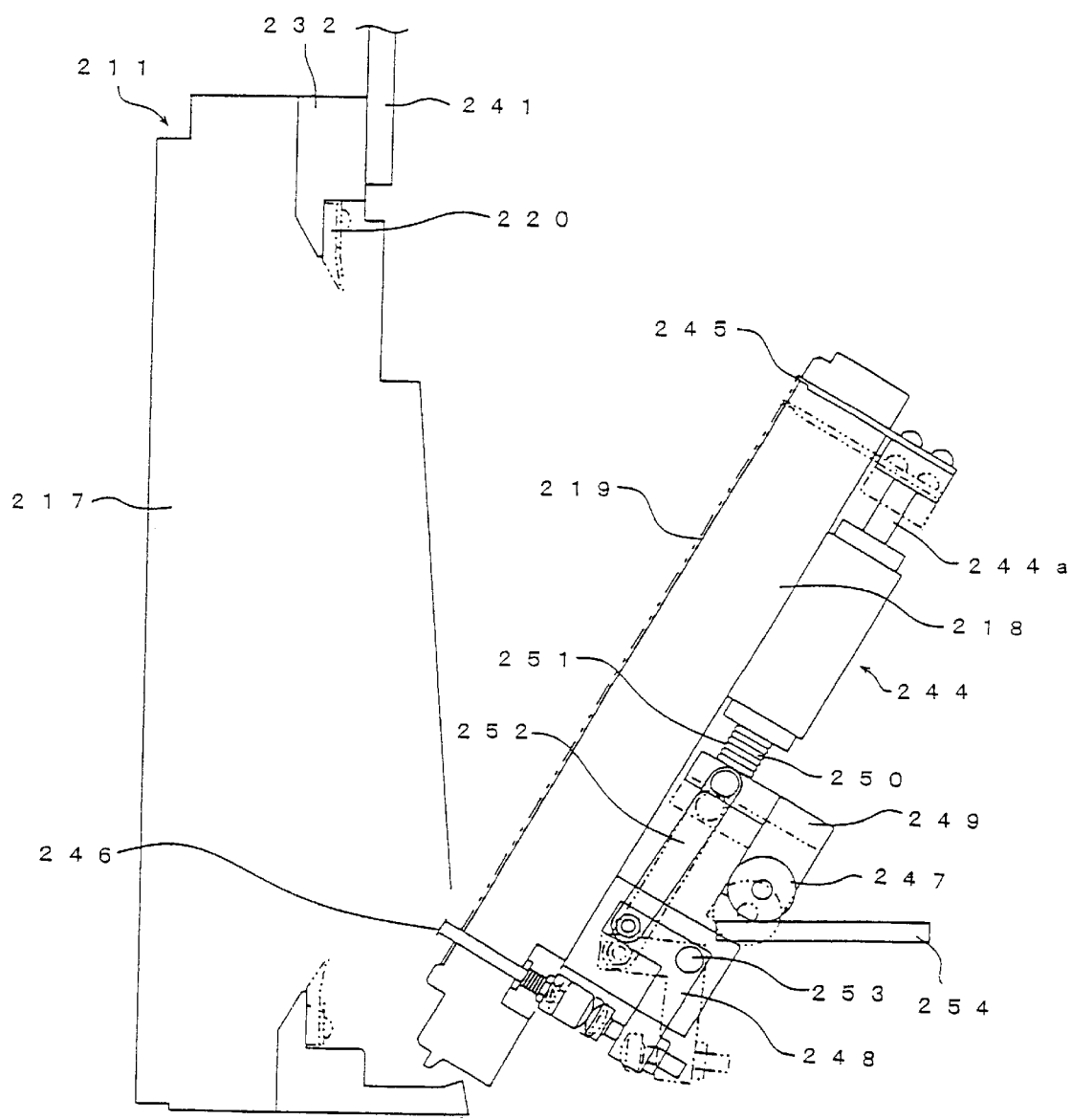
FIG. 23 shows a construction of the wafer mounting mechanism in a second position used in the plating apparatus of FIG. 18.

When the cover member 235 is in the open position indicated by the arrow C in FIG. 20, the substrate 219 is mounted on the side plate 218. FIGS. 22 and 23 show a construction of a wafer mounting mechanism. As shown in these diagrams, the wafer mounting mechanism includes a pawl drive cylinder 244 fixed to the side plate 218 and having a piston 244a. A wafer retaining pawl 245 is fixed to an end of the piston 244a and protrudes over a top surface of the side plate 218. A wafer retaining pawl 246 protrudes under a bottom surface of the side plate 218 via a spring or the like (not shown).

A rod 250 is fixed to a bottom end of the pawl drive cylinder 244. A sliding member 249 is provided freely and slidingly on the rod 250 via a spring 251. A roller 247 is rotatably fixed on one end of the sliding member 249. A pawl pushing member 248 is linked to another end of the sliding member 249 via a coupling member 252 for pushing the wafer retaining pawl 246. The pawl pushing member 248 is rotatably supported on a pin 253 serving as a pivot point. A contact member 254 is contacted by the roller 247.

In the wafer mounting mechanism described above, the cylinder 238 of FIG. 20 is operated to open the side plate 218 as shown in FIG. 23. At this time, the roller 247 contacts the contact member 254, thereby pushing up the sliding member 249. This pulls up on the end of the pawl pushing member 248 via the coupling member 252 and rotates the pawl pushing member 248 clockwise about the pin 253 such that the pawl pushing member pushes against the wafer retaining pawl 246. The pawl pushing member 248 forces the wafer retaining pawl 246 to protrude exactly a prescribed distance from a surface of the side plate 218. Next, by operating the pawl drive cylinder 244, the wafer retaining pawl 245 is moved upwardly a prescribed distance. At this state, distance between the wafer retaining pawls 245 and 246 is larger than the diameter of the substrate 219 by a prescribed length.

At this point, the substrate 219 gripped by the front end of the robot arm is put onto the upper surface of the side plate 218 between the wafer retaining pawls 245 and 246.

The sensor 233 (see FIG. 18A) detects that the substrate is set on the side plate 218. By operating the pawl drive cylinder 244, the wafer retaining pawl 245 is moved until it contacts a side edge of the substrate 219, and the substrate 219 is gripped between the wafer retaining pawl 246 and wafer retaining pawl 245. At this point, the substrate 219 is mounted on top of the side plate 218.

Next, the cylinder 238 of FIG. 20 is operated to extend the piston 238a. As the piston 238a extends, the cover member 235 rotates in the counterclockwise direction about the hinge mechanism 237. The side plate 218 also rotates in association with the cover member 235 in the counterclockwise direction. Accordingly, the roller 247 separates from the contact member 254, and the urging force of the spring 251 faces the sliding member 249 and coupling member 252 down a prescribed distance. This enables the pawl pushing member 248 to rotate counterclockwise about the pin 253, thereby releasing the wafer retaining pawl 246. The wafer retaining pawl 246 recedes to its original position, protruding from the surface of the side plate 218 only enough to support the outer edge of the substrate 219.

As described above, the side plate 218 closes over the opening of the main bath section 217. At this time, inner edge portion of the packing 220 sealingly contacts a surface on the peripheral edge of the substrate 219, thereby forming a space with the shielding plate 222, substrate 219, and packing 220 for the plating solution 223. The pump 214 of FIG. 16 is started to supply plating solution 223 through this space to perform a plating operation. However, if the pump is started before the substrate 219 is mounted on the side plate 218, the enclosed space for transporting the plating solution 223 is not yet formed and the plating solution 223 can spill externally. Therefore, in the present embodiment, the sensor 233 is provided to detect whether a substrate 219 is mounted on the side plate 218. If a substrate 219 is not mounted on the side plate 218, appropriate measures are taken, such as issuing a warning or at least preventing the pump 214 from starting, even if a starting switch is turned on. With this construction, a safe process can be performed without worrying about plating solution 223 being supplied to the plating bath 211 flowing out of the plating bath 211 when the substrate 219 is not mounted on the side plate 218.

Figure 24:
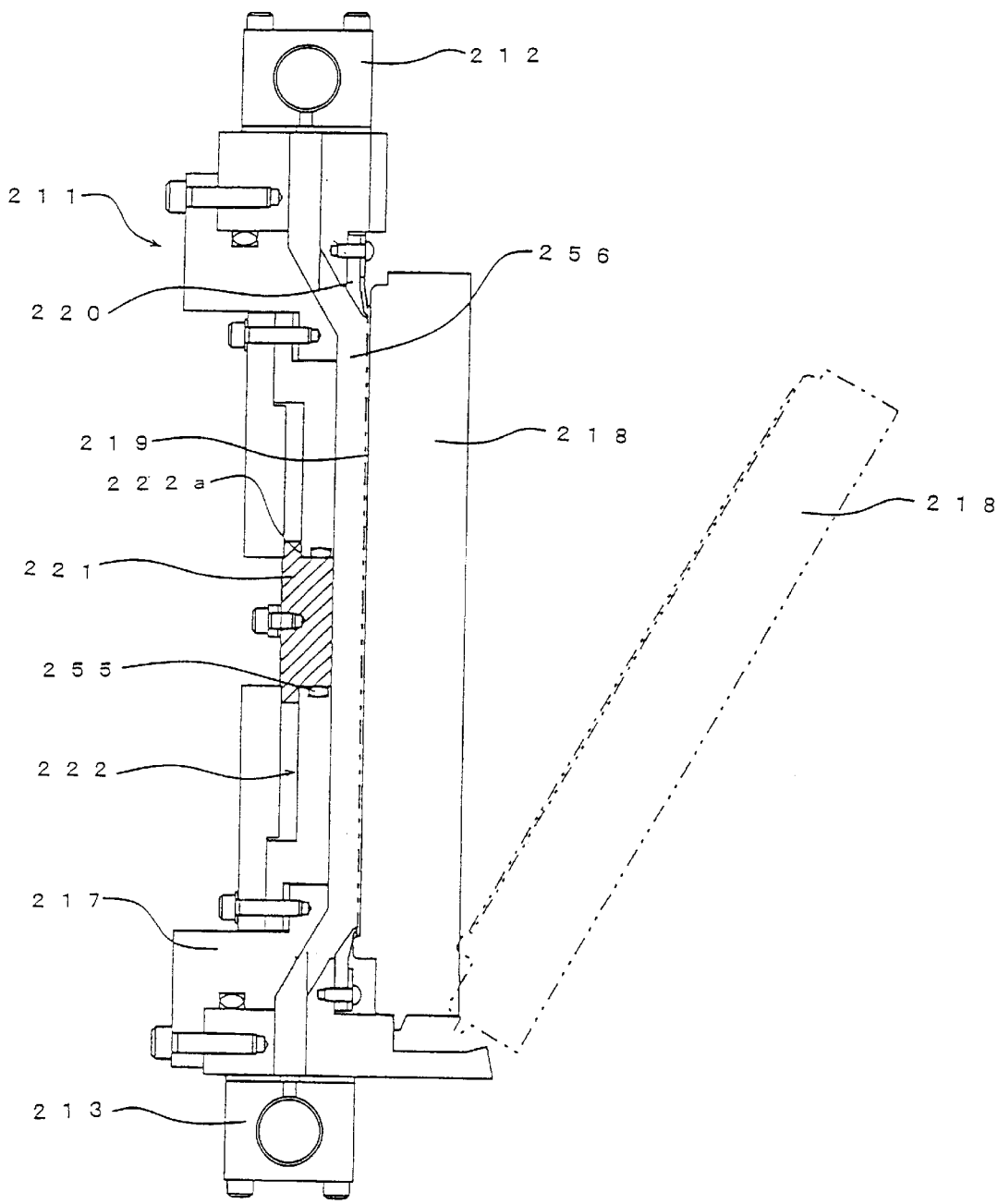
FIG. 24 shows another example of a construction of the plating bath used in the plating apparatus of the present invention.

FIG. 24 shows another example construction for a plating bath of the plating apparatus according to the present invention. As shown in the diagram, parts with like numbers relative to those in FIG. 16 indicate the same or similar parts. In FIG. 24, plating bath 211 is provided with shielding plate 222 fitted into main bath section 217. Surfaces of the main bath section 217 and shielding plate 222 are flush Hole 222a for adjusting an electric field is formed in a central portion of the shielding plate 222. Anode 221 is fitted into the hole 222a, such that surfaces of the shielding plate 222 and anode 221 are flush. A space 256 for accommodating a flow of plating solution is formed between side plate 218, shielding plate 222, anode 221 and substrate 219. An O-ring 255 is mounted between an inner peripheral surface of the hole 222a and an outer peripheral surface of the anode 221.

in the plating bath 211 having the construction shown in FIG. 24, a plurality of holes 217a and 217b, though not shown in this diagram, formed on a top and bottom of the main bath section 217 to allow plating solution to pass into the space 256, are the same as those shown in FIGS. 16 and 17. Structure for supplying plating solution from circulating tank 225 to the plating bath 211 also has the same construction as that shown in FIG. 16.

As described above, the surfaces of the main bath section 217, shielding plate 222, and anode 221 are flush. This construction can facilitate a smooth flow of plating solution through the space 256 between these surfaces and the substrate 219, thereby enabling formation of a uniform plating layer on a plating surface of the substrate 219.

Although the above embodiments describe a plating apparatus for plating an approximately round shaped substrate, such as a semiconductor wafer, it is obvious that the present invention can also apply to a rectangular shaped substrate, such as a glass substrate.

Next, a process of automatically analyzing and displaying components in a plating solution will be described.

Wiring grooves having a high aspect ratio can be uniformly filled by metal through a plating process. However, to perform reliable plating, it is necessary to occasionally analyze a concentration of various components in a plating solution throughout the process, and replenish those components that are lacking based on analysis results in order to maintain the plating solution at an accurate composition. This is particularly important in reduction plating using a catalyst, such as electroless plating, because margin for error in composition is small and the plating solution will decompose if the composition becomes unbalanced.

Figure 25:
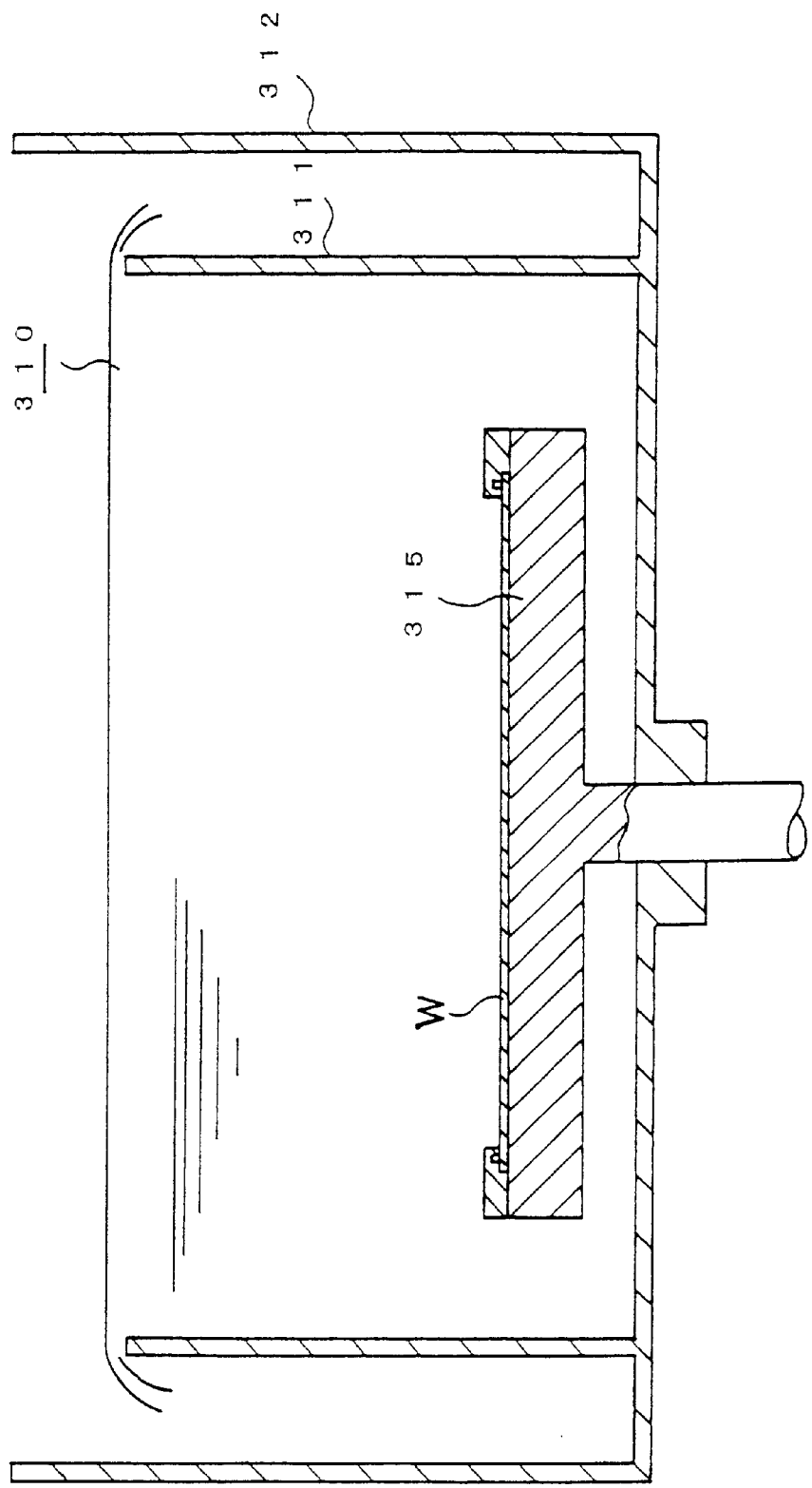
FIG. 25 is a cross-sectional view showing a plating bath for automatically analyzing components in a plating solution.

One method to treat this is to periodically sample the plating solution used in the plating process and analyze the components in the sample manually. However, this results in considerable time to acquire results of the analysis, and even more time when the number of components to analyze increases. In view of this, a plating apparatus for copper plating a wafer W will be described with reference to FIG. 25. A plating apparatus includes a plating bath 311 that accommodates plating solution 310 and an overflow vessel 312 that surrounds a periphery of the plating bath 311. A plating solution supply pipe (not shown) for continuously supplying plating solution to the plating bath 311 is provided on a bottom of the plating bath 311. A plating solution discharge pipe (not shown) is connected to a bottom of the overflow vessel 312 for circulating the plating solution flowing out of the plating bath 311 back to a storage tank (not shown).

A susceptor 315 for supporting the wafer W is positioned in the plating bath 311 and is capable of moving up and down. The plating process is performed by placing the wafer W on the susceptor 315 and immersing the wafer W into the plating solution 310.

Figure 26:
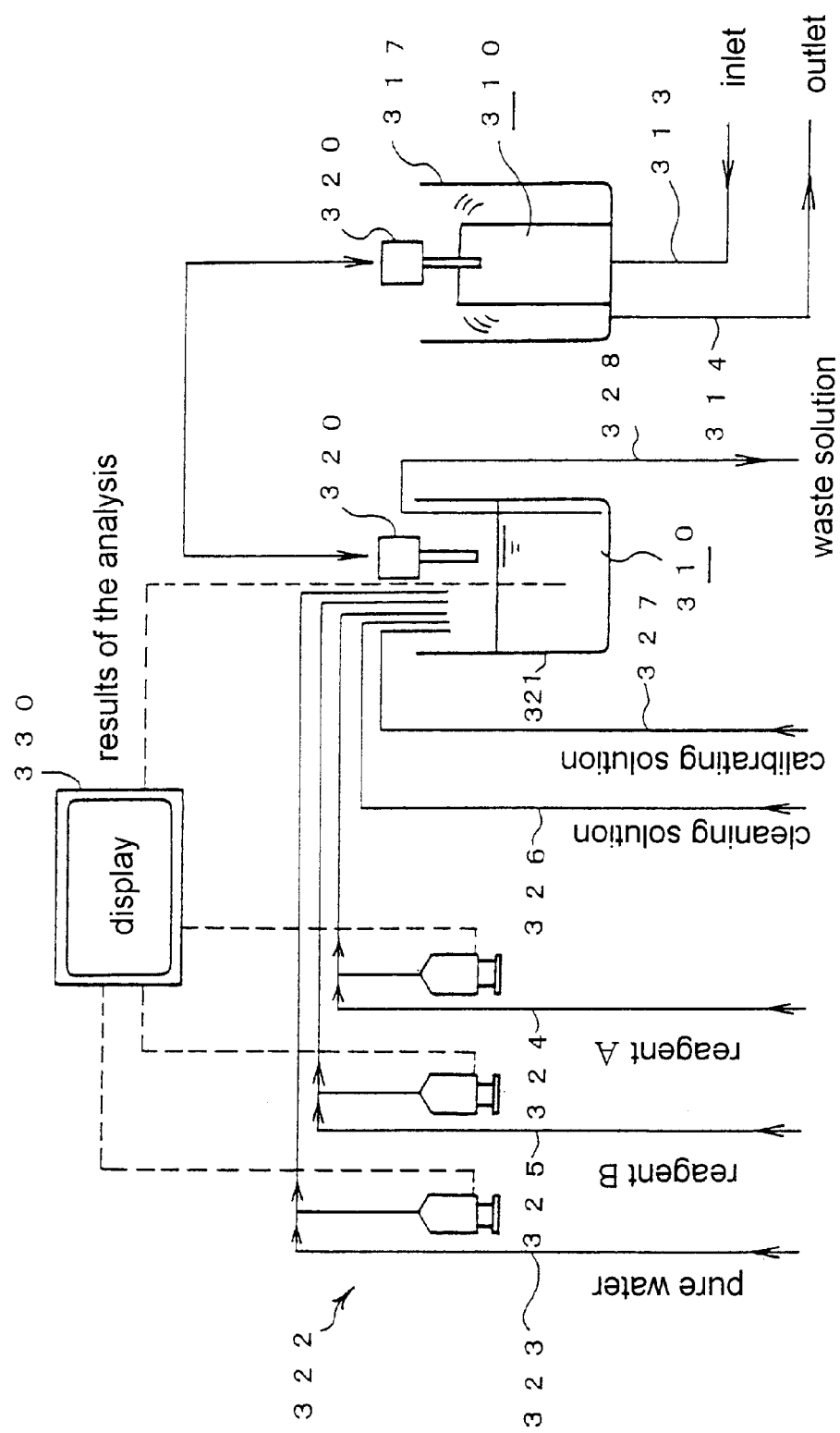
FIG. 26 is an explanatory diagram showing a concept of a device for automatically analyzing and displaying information about components in a plating solution.

This plating apparatus is also provided with an automatic analyzing and displaying device for analyzing components in the plating solution, as shown in FIG. 26. A sample circulating tank 317 is provided with a sample at regular periods, such as every 6 hours, of the plating solution 310 used in the plating process. At a prescribed time, the plating solution 310 from the plating bath 311 is circulated to the sample circulating tank 317 via pipes 313 and 314 connecting the plating bath 311 to the sample circulating tank 317. A titration cell 321 is disposed near the sample circulating tank 317. A sampling nozzle 320 moves reciprocatingly between the sample circulating tank 317 and titration cell 321 and drips plating solution 310 from the sample circulating tank 317 into the titration cell 321.

An automatic analyzer 322 is provided in the titration cell 321 for automatically analyzing the components in the plating solution 310 dripped into the titration cell 321. In the present embodiment, the analyzer 322 includes a pure water line 323 connected to the titration cell 321, a reagent A line 324, and a reagent B line 325. Reagents are automatically supplied through these lines to the titration cell 321 based on a computer program. The analyzer 322 then automatically analyzes the components of the plating solution 310.

A cleaning solution line 326 for supplying cleaning solution to the titration cell 321, a calibrating solution line 327 for supplying calibrating solution, and a discharge line 328 are all connected to the titration cell 321. Accordingly, after the analysis is completed, the analyzed plating solution (waste solution) is discharged through the discharge line 328. Subsequently, cleaning solution and calibrating solution are supplied to the titration cell 321 through the cleaning solution line 326 and calibrating solution line 327 to clean and calibrate an inside of the titration cell 321.

A display 330 is provided for displaying results of the automatic analysis performed by the analyzer 322. In addition to results of the analysis, items displayed on the display 330 include titration amounts added from the pure water line 323, reagent A line 324, and reagent B line 325. Based on this data, it is possible to predict changes in the components and maintain the plating solution at a proper composition by replenishing components that are lacking.

The plating solution in the example above is an electrolytic copper plating solution for an electrolytic plating process, and an electroless copper plating solution for an electroless plating process. The composition of these plating solutions is shown in Table 1 below

TABLE 1

An Example of Plating Solution Compositions and Injected Chemical Types (Basic Specifications)

| Elements, ions, chemical types, components, etc. | Plating Method | |
|---|---|---|
| | Electrolytic | Electroless |
| (Copper) $CuSO_4 \cdot 5H_2O$ (mol/l) | 0.3 | 0.04 |
| Sulfuric acid (mol/l) | 1.83 | |
| Additive* (ml/l) | 10 | |
| Chlorine ions** (mol/l) | $1.7 \times 10^{-3}$ | |
| EDTA***.4Na (Ethylene-diamin-tetraacetic acid.natrium) (mol/l) | | 0.08 |
| 27% TMAH**** tetra-methyl-ammonium hydroxide (ml/l) | | 56 |
| Formalin**** (mol/l) | | 0.1 |
| Water | | Remainder |

*Nonionic surface active agent (with inhibitor)
**For suppressing decomposition of the additive
*, **Both can be eliminated in pulse electrolytic plating
***Forms copper and a stable chelating compound
****Reducing agent (supplies OH)

Table 2 shows an example of plating conditions.

TABLE 2

| | Plating Conditions | |
|---|---|---|
| | Plating Method | |
| Conditions | Electrolytic | Electroless |
| Temperature (° C.) | 25 | 50 |
| Agitation | (50 ml/min)/100 ml due to air suction | |
| Current density (A/dm²) | DC 3, pulse 10 (maximum) | |
| Bath load (cm²/100 ml) | | 11 |
| pH | | 13.0 |

In the electrolytic copper plating process, the analyzer 322 measures various components required to maintain the electrolytic copper plating solution at a proper composition. These measurements include copper ion concentration, sulfuric acid concentration, chlorine ion concentration, and additive concentration. In the electroless copper plating process, the analyzer 322 measures components required to maintain the electroless copper plating solution at a proper composition. These measurements include copper ion concentration, reductant agent concentration, pH, chelate concentration, dissolved oxygen, dissolved hydrogen, and additive concentration. These results are all displayed on the display 330.

With the present invention described above, it is possible to periodically sample plating solution used in the plating process, automatically analyze this solution, and quickly display the results of this analysis on a monitor. With this method, it is possible to confirm concentration of components in the plating solution in advance, and always maintain the plating solution at a proper composition to ensure a stable plating process.

INDUSTRIAL APPLICABILITY

The plating apparatus of the present invention is appropriate for applications such as filling pits, for fine wiring and the like, formed in semiconductor wafers with a plating of metal such as copper. Accordingly, the present invention can be used in the field of semiconductor fabrication.

What is claimed is:
1. A substrate plating apparatus for continuously performing a plating process and a post-plating process within the apparatus, the substrate plating apparatus comprising:

a contaminated zone within which a plating process is to be performed;

a clean zone within which a post-plating process is to be performed; and a partition dividing the apparatus into said contaminated zone and said clean zone, wherein each of said contaminated zone and said clean zone is adapted to be independently ventilated.

2. The substrate plating apparatus according to claim 1, wherein said partition is provided with a shutter that can be opened and closed.

3. The substrate plating apparatus according to claim 1, wherein said contaminated zone is constructed and arranged to have present therein an air flow which includes a circulating flow circulating in said contaminated zone, a flow which is externally supplied into said contaminated zone, and a flow which is discharged from said contaminated zone, and said contaminated zone is also constructed and arranged such that the circulating flow is to flow downwardly as clean air from a ceiling of the apparatus through said contaminated zone and, after a scrubber and/or mist separator removes chemical mist or vapor of solution from the circulating flow, the circulating flow is to cycle back into said contaminated zone from the ceiling of the apparatus as clean air.

4. The substrate plating apparatus according to claim 1, further comprising:

conveying devices, provided one in each of said clean zone and said contaminated zone, for conveying a substrate through said contaminated and clean zones, with each of said conceying devices having a hand portion for retaining the substrate; and a coarse washing chamber, disposed adjacent to said partition, for coarsely washing the substrate while the substrate is being retained by the hand portion of the conveying device provided in said contaminated zone after the plating process has been completed.

5. A method for plating a substrate by continuously performing a plating process and a post-plating process within an apparatus, the method comprising:

partitioning an inside of the apparatus with a partition to form a contaminated zone and a clean zone, wherein each of said contaminated zone and clean zone is to be independently ventilated;

disposing a conveying device in each of said clean zone and said contaminated zone for conveying a substrate through said contaminated and clean zones;

disposing a coarse washing chamber adjacent to said partition; and coarsely washing the substrate while the substrate is retained by a hand portion of the conveying device disposed in said contaminated zone.

\* \* \* \* \*